US010066163B2

(12) United States Patent
Collins et al.

(10) Patent No.: US 10,066,163 B2
(45) Date of Patent: *Sep. 4, 2018

(54) MORPHOLOGICALLY AND SIZE UNIFORM MONODISPERSE PARTICLES AND THEIR SHAPE-DIRECTED SELF-ASSEMBLY

(71) Applicants: INTELLIGENT MATERIAL SOLUTIONS, INC., Princeton, NJ (US); THE TRUSTEES OF THE UNIVERSITY OF PENNSYLVANIA, Philadelphia, PA (US)

(72) Inventors: Joshua E. Collins, Philadephia, PA (US); Howard Y. Bell, Princeton, NJ (US); Xingchen Ye, Philadelphia, PA (US); Christopher Bruce Murray, Montgomery County, PA (US)

(73) Assignees: Intelligent Material Solutions, Inc., Princeton, NJ (US); The Trustees of the University of Pennsylvannia, Philadelphia, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/678,344

(22) Filed: Aug. 16, 2017

(65) Prior Publication Data
US 2017/0369777 A1     Dec. 28, 2017

Related U.S. Application Data

(63) Continuation of application No. 14/878,424, filed on Oct. 8, 2015, now Pat. No. 9,758,724, which is a
(Continued)

(51) Int. Cl.
| | |
|---|---|
| *C09K 11/77* | (2006.01) |
| *B82Y 30/00* | (2011.01) |
| *C30B 7/08* | (2006.01) |
| *B42D 15/00* | (2006.01) |
| *C01F 17/00* | (2006.01) |

(52) U.S. Cl.
CPC .......... *C09K 11/7791* (2013.01); *B42D 15/00* (2013.01); *B82Y 30/00* (2013.01); *C01F 17/0031* (2013.01); *C01F 17/0043* (2013.01); *C01F 17/0062* (2013.01); *C01F 17/0087* (2013.01); *C09K 11/7773* (2013.01); *C30B 7/08* (2013.01); *C01P 2002/52* (2013.01); *C01P 2002/54* (2013.01); *C01P 2002/72* (2013.01); *C01P 2002/84* (2013.01); *C01P 2004/04* (2013.01); *C01P 2004/10* (2013.01); *C01P 2004/11* (2013.01); *C01P 2004/16* (2013.01); *C01P 2004/20* (2013.01); *C01P 2004/32* (2013.01); *C01P 2004/40* (2013.01); *C01P 2004/42* (2013.01); *C01P 2004/52* (2013.01); *C01P 2004/62* (2013.01); *C01P 2004/64* (2013.01); *Y10T 428/2933* (2015.01)

(58) Field of Classification Search
CPC ............ C09K 11/7791; C09K 11/7773; B42D 15/00; B82Y 30/00; C01F 17/0031; C01F 17/0043; C01F 17/0062; C01F 17/0087; C30B 7/08; Y10T 428/2933
USPC ....................................................... 428/402
See application file for complete search history.

(56) References Cited

U.S. PATENT DOCUMENTS

| 7,175,778 B1 | 2/2007 | Bhargava et al. |
| 7,550,201 B2 | 6/2009 | Van Veggel et al. |
| (Continued) | | |

FOREIGN PATENT DOCUMENTS

| WO | 2009/046392 A1 | 4/2009 |
| WO | 2012/091778 A2 | 7/2012 |

OTHER PUBLICATIONS

International Search Report and Written Opinion for International Application No. PCT/US2011/054593, dated Jun. 13, 2012.
Chen et al., "Ultrasmall Monodisperse NaYF4:Yb3+/Tm3+ Nanocrystals with Enhanced Near-Infrared to Near-Infrared Upconversion Photoluminescence", ACS Nano, 2010, vol. 4, No. 6, pp. 3163-3168.
Chen et al., "Comparative investigation on structure and luminescence properties of fluoride phosphors codoped with Er3+Yb3+," Sprectrochimica Acta Part A 74, 2009, pp. 441-445.
Du et al., "Optically active uniform potassium and lithium rare earth fluoride nanocrystals derived from metal trifluroacetate precursors," Dalton Transations, No. 40, 2009, pp. 8574-8581.
(Continued)

*Primary Examiner* — Leszek Kiliman
(74) *Attorney, Agent, or Firm* — J.A. Lindeman & Co., PLLC

(57) ABSTRACT

Monodisperse particles having: a single pure crystalline phase of a rare earth-containing lattice, a uniform three-dimensional size, and a uniform polyhedral morphology are disclosed. Due to their uniform size and shape, the monodisperse particles self assemble into superlattices. The particles may be luminescent particles such as down-converting phosphor particles and up-converting phosphors. The monodisperse particles of the invention have a rare earth-containing lattice which in one embodiment may be an yttrium-containing lattice or in another may be a lanthanide-containing lattice. The monodisperse particles may have different optical properties based on their composition, their size, and/or their morphology (or shape). Also disclosed is a combination of at least two types of monodisperse particles, where each type is a plurality of monodisperse particles having a single pure crystalline phase of a rare earth-containing lattice, a uniform three-dimensional size, and a uniform polyhedral morphology; and where the types of monodisperse particles differ from one another by composition, by size, or by morphology. In a preferred embodiment, the types of monodisperse particles have the same composition but different morphologies. Methods of making and methods of using the monodisperse particles are disclosed.

20 Claims, 15 Drawing Sheets

Related U.S. Application Data continuation of application No. 13/876,266, filed as application No. PCT/US2011/054593 on Oct. 3, 2011, now Pat. No. 9,181,477.

(60) Provisional application No. 61/388,941, filed on Oct. 1, 2010, provisional application No. 61/487,784, filed on May 19, 2011, provisional application No. 61/487,785, filed on May 19, 2011.

(56) References Cited

U.S. PATENT DOCUMENTS

| | | | | |
|---|---|---|---|---|
| 7,550,344 | B2* | 6/2009 | Ito | H01L 27/105 |
| | | | | 257/E21.009 |
| 9,181,477 | B2* | 11/2015 | Collins | C01F 17/0031 |
| 9,758,724 | B2* | 9/2017 | Collins | C01F 17/0031 |
| 2007/0204790 | A1* | 9/2007 | Alkhawaldeh | B82Y 10/00 |
| | | | | 117/68 |
| 2009/0042314 | A1 | 2/2009 | Capobianco et al. | |
| 2010/0069659 | A1* | 3/2010 | Raichle | B01J 23/002 |
| | | | | 558/324 |
| 2010/0240901 | A1 | 9/2010 | Bulovic et al. | |
| 2010/0261263 | A1 | 10/2010 | Vo-Dinh et al. | |

OTHER PUBLICATIONS

Kim et al., "Color-coded multilayer photopatterned microstructures using lanthanide (III) ion co-doped NaYF4 nanoparticles with upconversion luminescence for possible applications in security," Nanotechnology, 20, 2009, 185301.

Yang et al., "Controlled Synthesis and Lumiescence of Lanthanide Doped NaYF4 Nanocrystals," Chem. Mater. 2007, 19, pp. 727-734.

Yi et al., "Synthesis of Hexagonal-Phase NaYF4:Yb,Er and NaYF4:Yb,Tm Nanocrystals with Efficient Up-Conversion Fluorescence," Wiley-VCH Verlag GMBH & Co., KGaA, DE, Adv. Funct. Mater., 2006, 16, pp. 2324-2329.

* cited by examiner

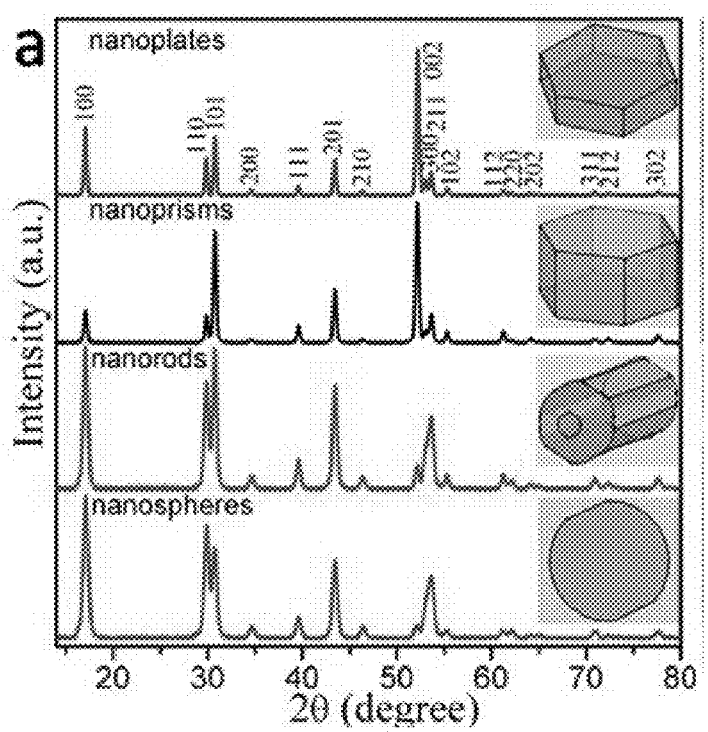
Fig. 4A
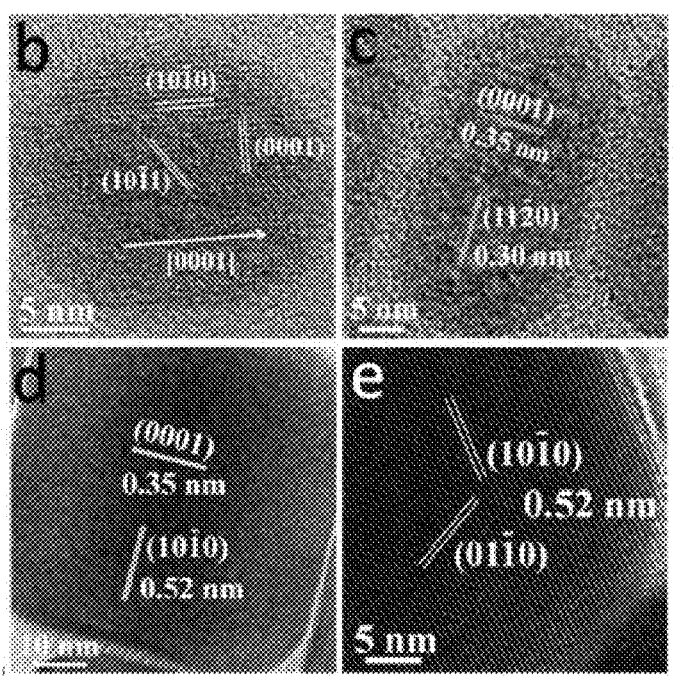
Fig. 4B
Fig. 4C
Fig. 4D
Fig. 4E

Fig. 5A
Fig. 5C
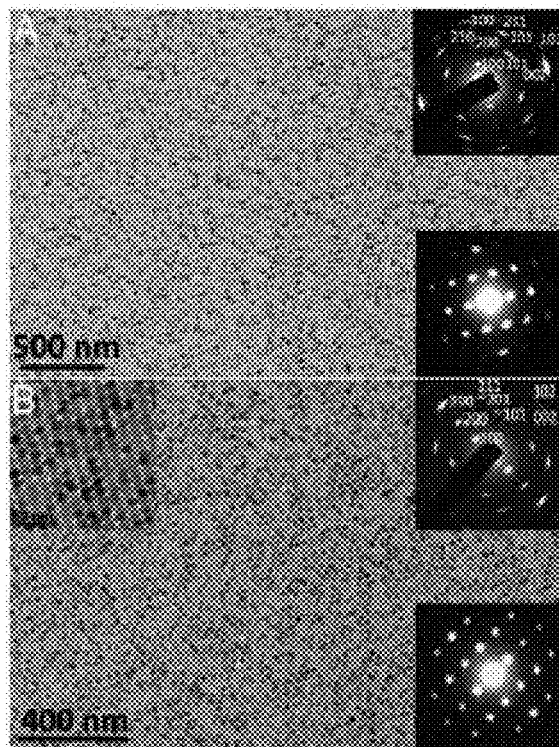
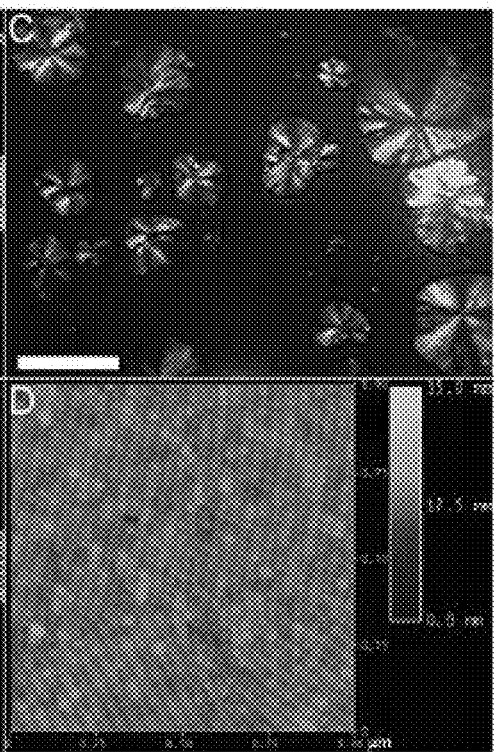
Fig. 5B
Fig. 5D

Fig. 6A
Fig. 6B
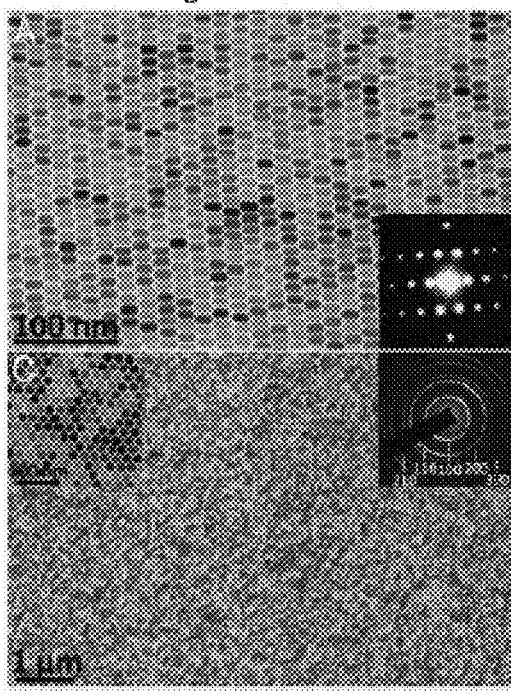
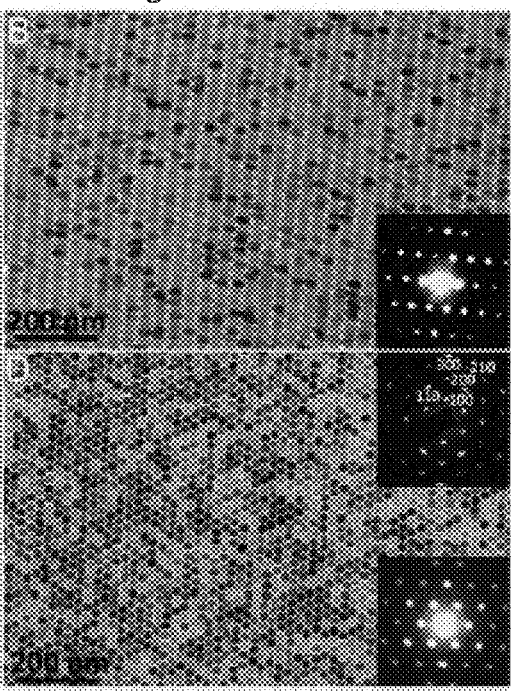
Fig. 6C
Fig. 6D

MORPHOLOGICALLY AND SIZE UNIFORM MONODISPERSE PARTICLES AND THEIR SHAPE-DIRECTED SELF-ASSEMBLY

CROSS-REFERENCE TO RELATED APPLICATIONS

This application claims priority to U.S. application Ser. No. 14/878,424, filed Oct. 8, 2015; which is a Continuation of application Ser. No. 13/876,266, filed Jun. 24, 2013, now U.S. Pat. No. 9,181,477; which claims priority to International PCT International Application No. PCT/US2011/054593, filed Oct. 3, 2011; which claims priority to Application No. 61/388,941, filed Oct. 1, 2010; to U.S. Application 61/487,784, filed May 19, 2011; and to U.S. Application 61/487,785, filed May 19, 2011; which are all incorporated herein by reference.

STATEMENT OF U.S. GOVERNMENT SUPPORT

This invention was made with U.S. government support under STIR grant R41E6008959 awarded by the National Institute of Health, under grant DMR-0505048 awarded by the National Science Foundation, under grant DMR 05-20020 awarded by the National Science Foundation, under grant NNX08AO0G awarded by the National Aeronautical and Space Agency, under grant W911NF-08-1-0364 awarded by the Army Research Office, under grant DMS-0935165 awarded by the National Science Foundation, and under grant DE-SC0002158 awarded by the Department of Energy. The U.S. government has certain rights in this invention.

BACKGROUND OF THE INVENTION

Recent advances in synthesis and controlled assembly of monodisperse colloidal nanocrystals into superlattice structures have enabled their applications in optics (1), electronics (2), magnetic storage (3), solar energy, etc. Single- and multi-component superlattices composed of spherical nanocrystals have been extensively studied in a variety of aspects such as structural diversity (4, 5), and electronic (6) and magnetic (7) interactions between the constituents. On the other hand, significant efforts have been put into developing new synthetic approaches for non-spherical nanocrystals that often exhibit physical properties unobtainable by simply tuning the size of the particles (8-11). However, the organization and application of these anisotropic building blocks have been limited mainly due to the lack of sufficient control over size uniformity, shape selectivity, surface functionality and the scarcity of convenient and reliable assembly methodology.

One particularly interesting class of materials which have wide potential as monodisperse colloidal nanocrystals are inorganic luminescent or electromagnetically active materials, crystalline materials that absorb energy acting upon them and subsequently emit the absorbed energy. Light emission is known as luminescence. A luminescent material which continues to emit light for greater than $10^{-8}$ seconds after the removal of the absorbed light is said to be phosphorescent. Phosphorescent substances are also known as phosphors. The half-life of the afterglow, or phosphorescence, of a phosphor will vary with the particular substance and typically ranges from about $10^{-6}$ seconds to days. Phosphors may generally be categorized as stokes (down-converting) phosphors or anti-stokes (up-converting) phosphors. Phosphors which absorb energy in the form of a photon and emit a lower frequency (lower energy, longer wavelength) band photon are down-converting phosphors. In contrast, phosphors which absorb energy in the form of two or more photons in a low frequency and emit in a higher frequency (higher energy, shorter wavelength) band are up-converting phosphors. Up-converting phosphors, for example, are irradiated by near infra-red light, a lower energy, longer wavelength light, and emit visible light which is of higher energy and a shorter wavelength. Phosphors may also be categorized according to the nature of the energy which excites the phosphor. For example, phosphors which are excited by low energy photons are called photoluminescent and phosphors which are excited by cathode rays are called cathodluminescent.

Lanthanide-doped nanophosphors have become an emerging class of optical materials during the past few years (12). These nanophosphors often possess "peculiar" optical properties (e.g., quantum cutting (13) and photon upconversion (14)), allowing the management of photons that could benefit a variety of areas including biomedical imaging (15, 16) and therapy (17), photovoltaics (13, 18), solid state lightning (19), and display technologies (20). Colloidal upconversion nanophosphors (UCNPs) are capable of converting long-wavelength near-infrared excitation into short-wavelength visible emission through the long-lived, metastable excited states of the lanthanide dopants (21). In contrast to the Stokes-shifted emissions from semiconductor nanocrystals or organic fluorophores and the multiphoton process employing fluorescent dyes, UCNPs offer several advantages including narrow, tunable emission bands (22), non-blinking emission and remarkable photostablity (15, 23), good brightness under low power continuous wave laser excitation, low autofluorescence background and deep penetration depths in biological systems (15, 16), etc. It has been widely accepted that hexagonal phase $NaYF_4$ ($\beta$-$NaYF_4$) is one of the best host materials for upconversion due to its low phonon energies (24), being more efficient than the cubic, $\alpha$-$NaYF_4$ phase (25). Several chemical approaches including coprecipitation (26) and hydrothermal synthesis (27) have been employed to synthesize $\beta$-$NaYF_4$-based UCNPs. However, these methods are usually limited by drawbacks such as the necessity of post-synthesis treatment to improve crystallinity of the products, long reaction time (ranging from a few hours up to several days) and the use of specialized reactors (e.g., autoclaves). The synthesis of lanthanide fluoride nanocrystals via the thermal decomposition of metal trifluoroacetate precursors has been described (28, 29). Preparations of $\beta$-$NaYF_4$-based UCNPs through decomposition of mixed trifluoroacetates (30) or through a two-step ripening process using the premade $\alpha$-$NaYF_4$ nanocrystals as precursors (31) were subsequently reported. Other reported methods to prepare monodisperse inorganic phosphor particles include sol-gel methods (U.S. Pat. No. 5,637,258); fluidized bed methods (U.S. Pat. No. 6,039,894); and solution-precipitation of precursors followed by heating (U.S. Pat. No. 6,132,642). Despite these recent progresses, the feasibility of the synthetic approach and the quality of the as-synthesized UCNPs or other inorganic particles using existing recipes are still far from satisfactory. There remains a need for a straightforward synthesis of not only UCNPs but for luminescent or electromagnetically active inorganic particles in general.

UCNPs, as one example, and other inorganic phosphor particles as well, are employed in a wide variety of applications, for example, in labeling, 3-D volumetric displays and in diagnostic assays. See, e.g., U.S. Pat. Nos. 4,870,485;

5,943,160; 5,043,265; 5,698,397; and 7,858,396; and U.S. Published Application 2007/0247595. Upconverting and downconverting phosphors are also used in smaller niche areas such as cosmetic/cosmeceutical, printed art, vehicle automation and guidance, process control, among others.

Inorganic phosphors are used, for example, to label security documents or currency. Phosphor particles may be incorporated into a document, currency or other security articles and detected to determine its authenticity. Phosphors used in this way are often called "taggants." Combinations of different phosphor particles with different excitation and/or emission wavelengths, are used to provide a unique security signature to the security document or currency, etc. See U.S. Pat. Nos. 7,030,371; 7,790,056; 7,927,511; and 7,999,237. Similarly, phosphor particles may be incorporated into bulk materials, such as raw ingredients, and provide a label or signature that identifies the source and/or integrity of the bulk material. See, e.g., U.S. Pat. Nos. 7,323,696 and 6,536,672.

Diagnostic assays employ phosphor particles as detection labels to show the presence or absence of a particular analyte of interest. The phosphor particles may be surface treated to enable them to bind to the biological components of the assay and/or the analyte of interest. Using phosphor particles with different excitation and/or emission wavelengths allow for multiplexing—the detection of more than one analyte in a single assay using different labels to identify particular analytes. See, e.g., U.S. Pat. Nos. 5,043,265; 5,698,397; and 7,858,396. Phosphor particles find numerous uses in in vitro diagnostics, including point-of-care diagnostics, flow cytometry, high throughput screening for drug discovery, genetic analyses, or early detection of disease. Generally, the types of analyses in this area encompass; state of health, congenital diseases, progress or course of treatment, and but not limited to determination of compatibility in blood or organ donations and transplants and labeling of cellular markers for use in pathological analysis of specimens. There are applications across many fields of medicine for medical imaging in the diagnosis and tracking of disease and in therapeutics such as Photodynamic Therapy, a light-based cancer therapy used for various malignancies. For example, phosphor particles are also used in biomedical imaging and therapy where the phosphors attach to tissue or cells for use in both in vitro and in vivo testing as well as in treatment of disease such as cancer See, e.g., Xiong L, Yang T, Yang Y, Xu C, Yi F (2010) Biomaterials, 7078-7085, and Ungun B, Prud'homme R, Budijono S, et al. (2008) Optics Express 17(1), 80-86.

The differentiation among phosphors or combination of different phosphors as labels is dependent on the use of a combination of different phosphor based on phosphor composition. As described in U.S. Pat. No. 5,698,397, phosphors may use different combination of absorbers and emitters to create unique phosphors. For example, a plurality of phosphors may absorb the same wavelength of light but, by having different emitters, emit at different wavelengths. Alternatively, a plurality of phosphors may emit the same wavelength but absorb different wavelengths. Of course, the phosphors in a plurality of phosphors may each have its own unique absorption wavelength and unique emission wavelength. Thus, based on the particular phosphor composition, different absorption and/or emission profiles are possible. This compositional differentiation is needed when the phosphor particles are spherical or do not have a uniform shape distribution. This, in turns, places demands and constraints on the equipment used when combinations of phosphors are used to create a unique signature or to differentiate among analytes.

SUMMARY OF THE INVENTION

In one embodiment, the invention relates to a plurality of monodisperse particles having: a single pure crystalline phase of a rare earth-containing lattice, a uniform three-dimensional size, and a uniform polyhedral morphology. Due to their uniform size and shape, the monodisperse particles self assemble into superlattices, which represent a further embodiment of the invention. The particles may be luminescent particles such as down-converting phosphor particles and up-converting phosphors and have the utilities known for such phosphors. In another embodiment of the invention, the monodisperse particles are crystalline nanoparticles. The monodisperse particles of the invention have a rare earth-containing lattice which in one embodiment may be an yttrium-containing lattice or in another may be a lanthanide-containing lattice. The various monodisperse particle compositions and morphologies indentified below each represent a separate embodiment of the invention.

The monodisperse particles of the invention may have different optical properties based on their composition, their size, and/or their morphology (or shape). In another embodiment, the invention relates to a combination of at least two types of monodisperse particles, where each type is a plurality of monodisperse particles having a single pure crystalline phase of a rare earth-containing lattice, a uniform three-dimensional size, and a uniform polyhedral morphology; and where the types of monodisperse particles differ from one another by composition, by size, or by morphology. In a preferred embodiment, the types of monodisperse particles have the same composition but different morphologies.

The invention also relates to a method for the preparation of monodisperse particles of the invention. The method employs the steps of: in a reaction vessel, dissolving at least one precursor metal salt in a solvent to form a solution; placing the reaction vessel in a heated salt bath having a temperature of at least about 340° C.; applying heat to the salt bath to rapidly decompose the precursor metal salts in the solution to form the monodisperse particles; keeping the reaction vessel in the salt bath for a time sufficient to increase the size of the monodisperse particles; removing the reaction vessel from the salt bath; and quenching the reaction with ambient temperature solvent.

BRIEF DESCRIPTION OF THE FIGURES

FIGS. 4A-4G show the structural and optical characterization of the $\beta$-$NaYF_4$-based upconverting nanophosphor particles of the invention.

FIGS. 5A-5D show $NaYF_4$ (AR=1.4) nanorod superlattices of the invention.

FIGS. 6A-6D show $NaYF_4$ (AR=2.0) nanorod superlattices of the invention.

DETAILED DESCRIPTION

Figure 1:
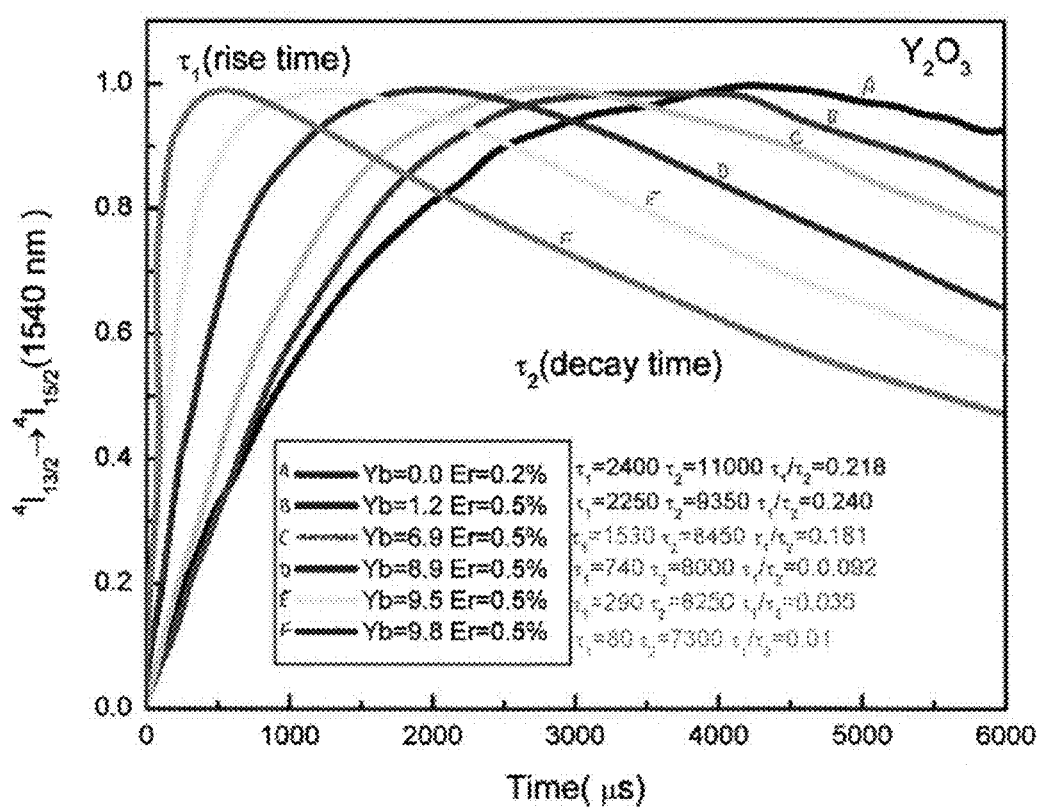
FIG. 1 shows the rise/decay times of Yttrium Oxide upconverting phosphor particles of the invention having varying Ytterbium/Erbium ratios.

The invention relates to monodisperse particles having a single pure crystalline phase of a rare earth (RE)-containing lattice, a uniform three-dimensional size, and a uniform polyhedral morphology. RE elements include yttrium and the elements of the lanthanide (Ln) series, i.e., lanthanum (La), cerium (Ce), praseodymium (Pr), neodymium (Ne), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Having uniform three-dimensional size and uniform polyhedral morphology, the monodisperse particles of the invention have the same dimensions and the same shape, within a tolerance of about 10 nm or less. Depending on their composition, monodisperse particles of the invention may have crystal symmetries of, but not limited to, tetragonal bipyramids, hexagonal prisms, rods, hexagonal plates, ellipsoids, trigonal prisms, and triangular plates which determine the uniform polyhedral morphologies of the particular particles. Being of uniform three-dimensional size and uniform polyhedral morphology allows the particles to uniformly orient themselves in a three-dimensional pattern having the lowest free energy state for the assemblage. In other words, the monodisperse particles of the invention advantageously self-assemble or "tile" to form super lattices. These superlattices are themselves another embodiment of the invention, discussed below.

The monodisperse particles of the invention may vary in size. In one embodiment, particles of the invention may be described as nanocrystals or colloidal particles with their largest dimension being approximately 1 nm to 1,000 nm in size. Large particles, with at least one dimension of approximately 1 μm to 250 μm, represent another embodiment of the invention. The size of the particle depends on the stoichiometric ratio of elements making the particle or the stoichiometric ratio precursor used to prepare the particle as well as the length of reaction time, discussed below.

Monodisperse particles of the invention have a single pure crystalline phase of a RE-containing lattice (e.g., an yttrium-containing lattice or a lanthanide-containing lattice). The lattice contains yttrium (Y) or a lanthanide (Ln) in its +3 oxidation state. The charge is balanced in the lattice by the presence of an anion such as a halide (fluoride, $F^-$, being preferred), an oxide, an oxysulfide, an oxyhalide (e.g., OCl), a sulfide, etc. Alkali metals, i.e., lithium (Li), sodium (Na), potassium (K), rubidium (Rb), and cesium (Cs) and/or alkali earth metals beryllium (Be), magnesium (Mg) calcium (Ca), strontium (Sr), and barium (Ba) may also be a component of the host lattice. The alkali metals or alkaline earth metals are often called "lattice modifiers." For the synthesis of monodisperse particles of the invention, the alkali metal or alkaline earth metal present in the lattice may determine the crystal symmetry providing morphological control over the particles as well as independent tunability of a particle's other properties, such as the optical properties of a luminescent particle. For example, the crystal symmetry of $LiYF_4$, $NaYF_4$, and $KYF_4$ are tetragonal, hexagonal, and trigonal, respectively. The chemical composition of the particles of the invention provides unique polyhedral morphologies. Representative yttrium-containing lattices include, but are not limited to $LiYF_4$, $BaYF_5$, $BaY_2F_8NaYF_4$, $KYF_4$, $Y_2O_2S$, $Y_2O_3$, and the like. The lanthanide-containing lattice may be one having any element of the lanthanide series. Representative lanthanide-containing lattices include, but are not limited to, $LaF_3$, $CeF_3$, $PrF_3$, $NeF_3$, $PmF_3$, $SmF_3$, $EuF_3$, $GdF_3$, $TbF_3$, $DyF_3$, $HoF_3$, $ErF_3$, $TmF_3$, $YbF_3LuF_3$, $NaGdF_3$, $Gd_2OS_2$, $LiHoF_4$, $LiErF_4$, CeO, SrS, CaS, GdOCl, and the like. Compositions having such a lattice are known in the art to be inorganic luminescent materials and/or electromagnetically active materials. As known in the art, these compositions typically contain dopants and lattice modifiers, discussed below, that impart unique properties to the composition. As described below, the methods of the invention may be used to prepare monodisperse particles according to the invention having those compositions.

As discussed above, the luminescent materials are typically phosphors. Both up-converting phosphors and down-converting phosphors are known for RE-containing lattices. Compositions having a RE-containing lattice are also known to have electromagnetic properties and are useful as semiconductors. Exemplary compositions and their properties are discussed below. According to the invention, particles having those compositions may be prepared such that the particles are particles of the invention—monodisperse particles having a single pure crystalline phase of an yttrium-containing or a lanthanide-containing lattice, a uniform three-dimensional size, and a uniform polyhedral morphology.

Luminescent Inorganic Materials (Phosphors)

An inorganic phosphor comprises a crystalline structure known in the art as a host lattice, which the host lattice can be combined with a light emitting dopant. Such host lattice structures and host lattice-dopant combinations are commonly known in the art. Monodisperse particles of the invention have a single pure crystalline phase of RE-containing lattice, e.g., an yttrium-containing or a lanthanide-containing lattice as the host lattice. A "dopant" is a substance that absorbs primary light energy originating from the light source and emits secondary light of a secondary wavelength in response to said primary light energy. When used in combination with a host lattice, the dopant typically is an elemental substitute in the host lattice crystal, serving as a substitute for another element. The element being replaced depends on the composition of the host lattice. For the yttrium-containing or lanthanide-containing lattices used in the particles of the invention, the dopant is often an RE metal, quite often a lanthanide or combination of lanthanides, such as Y, Gd, and La (although the dopant is different from the RE in host lattice). The dopant element is generally of the same charge and also generally at a small level compared to the element that it is replacing. For example, in a host lattice-dopant combination of NaYF$_4$: Yb,Er, ytterbium and erbium are the dopants and NaYF$_4$ is the host lattice material. The ytterbium ions and erbium ions are substituted in for the yttrium ions in the host lattice material. In a host lattice-dopant combination, the phosphor generally substitutes another element for one in the host lattice in a small percentage that gives optical emission properties. A phosphor serving this purpose can comprise a single dopant or can comprise multiple dopants, and one of the dopants might act as a sensitizer. When present, a sensitizer ion is the primary absorber for the phosphor, but is not the main emitter. The energy that the sensitizer absorbs is transferred to the main active emitter ion (main dopant) through non-radiate transfer.

Down-Converting Phosphors

Down-converting inorganic phosphors are well known in the art. These materials can absorb X-Ray to UV energies and convert to lower energy visible or infrared wavelengths. For example, down-converting phosphor materials include RE element doped oxides, RE element doped oxysulfides, RE element doped fluorides. Examples of down-converting phosphors include, but are not limited to Y$_2$O$_3$:Gd, Y$_2$O$_3$:Dy, Y$_2$O$_3$:Tb, Y$_2$O$_3$:Ho, Y$_2$O$_3$:Er, Y$_2$O$_3$:Tm, Gd$_2$O$_3$:Eu, Y$_2$O$_2$S:Pr, Y$_2$O$_2$S:Sm, Y$_2$O$_2$S:Eu, Y$_2$O$_2$S:Tb, Y$_2$O$_2$S:Ho, Y$_2$O$_2$S:Er, Y$_2$O$_2$S:Dy, Y$_2$O$_2$S:Tm, Y$_2$O$_2$S:Eu (red), Y$_2$O$_3$:Eu (red), and YVO$_4$:Eu (red). Other examples of down-converting phosphors are sodium gadolinium fluorides doped with other lanthanides, e.g., NaGdF$_4$:Tb, wherein the Tb can be replaced with Eu, Dy, Pr, Ce, etc. Lanthanide fluorides are also known as down-converting fluorides, e.g., TbF$_3$, EuF$_3$, PrF$_3$, and DyF$_3$.

Up-Converting Phosphors

A large variety of up-converting inorganic phosphor compositions are also known in the art. As is known in the art, up-converting phosphors derived from RE-containing host lattices, such as described above, doped with at least one activator couple comprising a sensitizer (also known as an absorber) and an emitter. Suitable up-converting phosphor host lattices include: sodium yttrium fluoride (NaYF$_4$), lanthanum fluoride (LaF$_3$), lanthanum oxysulfide, RE oxysulfide (RE$_2$O$_2$S), RE oxyfluoride (RE$_4$O$_3$F$_6$), RE oxychloride (REOCl), yttrium fluoride (YF$_3$), yttrium gallate, gadolinium fluoride (GdF$_3$), barium yttrium fluoride (BaYF$_5$, BaY$_2$F$_8$), and gadolinium oxysulfide, wherein the RE can be Y, Gd, La, or other lanthanide elements. Suitable activator couples are selected from: ytterbium/erbium, ytterbium/thulium, and ytterbium/holmium. Other activator couples suitable for up-conversion may also be used. By combination of RE-containing host lattices with just these three activator couples, at least three phosphors with at least three different emission spectra (red, green, and blue visible light) are provided. Generally, the absorber is ytterbium and the emitting center can be selected from: erbium, holmium, terbium, and thulium; however, other up-converting phosphor particles of the invention may contain other absorbers and/or emitters. The molar ratio of absorber:emitting center is typically at least about 1:1, more usually at least about 3:1 to 5:1, preferably at least about 8:1 to 10:1, more preferably at least about 11:1 to 20:1, and typically less than about 250:1, usually less than about 100:1, and more usually less than about 50:1 to 25:1, although various ratios may be selected by the practitioner on the basis of desired characteristics (e.g., chemical properties, manufacturing efficiency, excitation and emission wavelengths, quantum efficiency, or other considerations). For example, increasing the Yb concentration slightly alters the absorption properties, which is useful for biomedical applications. The phosphor particle of the invention can be excited at 915 nm instead of 980 nm where the water absorption is much higher and more tissue heating occurs. The ratio(s) chosen will generally also depend upon the particular absorber-emitter couple(s) selected, and can be calculated from reference values in accordance with the desired characteristics. It is also possible to control over particle morphologies by drastically changing the ratio of the activators without the emission properties changing drastically for most of the ratios but quenching may occur at some point.

The optimum ratio of absorber (e.g., ytterbium) to the emitting center (e.g., erbium, thulium, or holmium) varies, depending upon the specific absorber/emitter couple. For example, the absorber:emitter ratio for Yb:Er couples is typically in the range of about 20:1 to about 100:1, whereas the absorber:emitter ratio for Yb:Tm and Yb:Ho couples is typically in the range of about 500:1 to about 2000:1. These different ratios are attributable to the different matching energy levels of the Er, Tm, or Ho with respect to the Yb level in the crystal. For most applications, up-converting phosphors may conveniently comprise about 10-30% Yb and either: about 1-2% Er, about 0.1-0.05% Ho, or about 0.1-0.05% Tm, although other formulations may be employed.

Some embodiments of the invention employ inorganic phosphors that are optimally excited by infrared radiation of about 950 to 1000 nm, preferably about 960 to 980 nm. For example, but not by limitation, a microcrystalline inorganic phosphor of the formula YF$_3$:Yb$_{0.10}$Er$_{0.01}$ exhibits a luminescence intensity maximum at an excitation wavelength of about 980 nm. Up-converting phosphors of the invention typically have emission maxima that are in the visible range. For example, specific activator couples have characteristic emission spectra: ytterbium-erbium couples have emission maxima in the red or green portions of the visible spectrum, depending upon the phosphor host; ytterbium-holmium couples generally emit maximally in the green portion, ytterbium-thulium typically have an emission maximum in the blue range, and ytterbium-terbium usually emit maximally in the green range. For example, Y$_{0.80}$Yb$_{0.19}$Er$_{0.01}$F$_2$ emits maximally in the green portion of the spectrum.

Particle Properties Based on Composition, Morphology, and Size

Properties of the monodisperse particles can be tuned in a variety of ways. As known in the art and discussed above, the properties of the monodisperse particles, the characteristic absorption and emission spectra, may be tuned by adjusting their composition, e.g., by selecting a host lattice, and/or by doping. Additionally and advantageously, given their uniform polyhedral morphology, the monodisperse particles of the invention exhibit anisotropic properties. Particles of the same composition but different shape exhibit different properties due to their shape and/or size. In one exemplary embodiment of the invention, the monodisperse particles, particularly UCNP's, of the invention are varied in composition and/or shape to give different decay lifetimes. Having different spectral decay lifetimes allows unique phosphor particles to be differentiated from one another. The ability to have monodisperse particles of the same composition but different morphologies according to the invention permits use of one composition (especially in regulated industries such as pharmaceuticals or medical devices) but to distinguish its morphologies through their unique optical properties. However, to take advantage of this, to tune the particle and its optical properties in this way, has not been possible but is now achieved with the monodisperse particles of the invention.

Thus, in addition to the characteristic absorption and emission spectra that can be obtained the rise and decay times of a monodisperse particle of the invention can also be tuned by particle size and morphology. The rise time is measured from the moment the first excitation photon is absorbed to when the first emission photon is observed. The decay time is measured by the slope of the emission decay, or the time it takes for the phosphor to stop emitting once the excitation source is turned off. This is also described as the time it takes for depletion of electrons from the excited energy levels. FIG. 1 shows the rise and decay time tunability of a $Y_2O_3$:Yb,Er doped phosphor particles of the invention excited at 1540 nm. By changing the dopant ratio, the rise and decay times can be reliably altered.

Briefly, typically an excited state population decays exponentially after turning off the excitation pulse by first-order kinetics, following the decay law, $I(t)=I_0 \exp(-t/\tau)$, whereby for a single exponential decay $I(t)$=time dependent intensity, $I_0$=the intensity at time 0 (or amplitude), and $\tau$=the average time a phosphor (or fluorophor) remains in the excited state (or $<t>$) and is equal to the lifetime. (The lifetime $\tau$ is the inverse of the total decay rate, $\tau=(T+k_{nr})^{-1}$, where at time t following excitation, T is the emissive rate and $k_{nr}$ is the non-radiative decay rate). In general, the inverse of the lifetime is the sum of the rates which depopulate the excited state. The luminescence lifetime can be simply determined from the slope of a plot of $\ln I(t)$ versus t (equal to $1/\tau$). It can also be the time needed for the intensity to decrease to 1/e of its original value (time 0). Thus, for any given known emission wavelength, a number of parameters fitting the exponential decay law can be monitored to identify a particular phosphor or group of phosphors, thus permitting their use, for example, in developing unique anti-counterfeiting codes, signatures, or labels/taggants.

In most instances, lifetimes are controlled by variations in the crystal composition or overall particle size. However, by controlling the particle morphology and uniformity as with the monodisperse particles of the invention one can create particles of visually distinct morphologies possessing lifetimes that are unique to that morphology while maintaining identical chemical compositions among the various morphologies. This feature allows for a highly complex optical signature or taggant which, as discussed above, may be used in serialization and multiplexing assays or analysis in various fields such as, for example, assays, biomedical, optical computing, as well as use in security and authentication.

Figure 2:
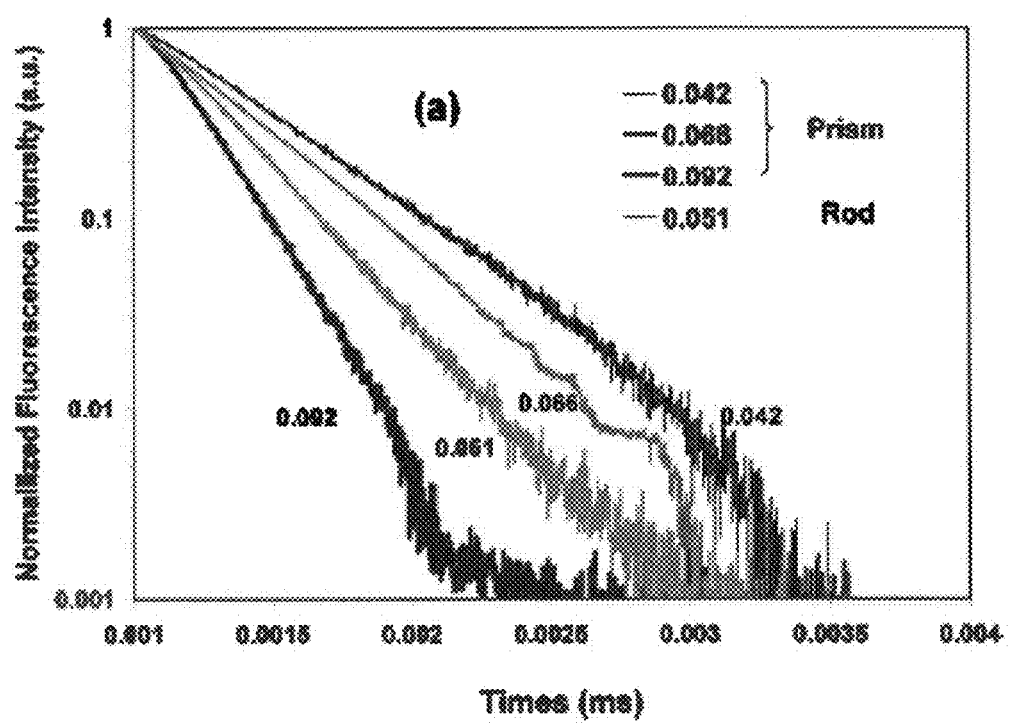
FIG. 2 shows the lifetimes of various morphologies and Surface Area/Volume (SA/Vol) ratios of $NaYF_4$ hexagonal prisms of the invention at an excitation wavelength was 980 nm, Emission Lifetime read at 543 nm.

To illustrate, the dependences of upconversion luminescence (UCL) on the particle size, shape, and inorganic-ligand interface of the hexagonal ($\beta$)-phase $NaYF_4$:Yb,Er upconverting nanophosphors of the invention were investigated (see Shan J, Uddi M, Wei R, Yao N, Ju Y. (2010) J. Phys. Chem 114, 2452-2461). The relative luminescent intensity, power-dependent luminescence, green to red emission intensity ratio (fg/r), and dynamic luminescence lifetimes of the prism-, plate-, and rod-shaped hexagonal ($\beta$)-phase $NaYF_4$:Yb,Er particles of the invention as a function of surface to volume (SA/Vol) ratio was measured. The upconverting properties of the particles can be attributed to not only the surface effects by comparing the SA/Vol ratios but also the particle morphologies or shapes. At the comparable SA/Vol and ion (Yb/Er) doping ratios (20%/2%), the prism-shaped nanocrystal particles showed increased intensity and smaller saturation power than those of the rod-shaped nanocrystals. Therefore, the differently shaped nanocrystals with identical SA/Vol ratios could have different lattice energy and multiphonon relaxation processes, such as shown in FIG. 2. The lifetimes of various morphologies and Surface Area/Volume (SA/Vol) ratios of $NaYF_4$ hexagonal prism particles for the invention are shown in FIG. 2. The excitation wavelength was 980 nm and the emission lifetime was read at 543 nm.

Methods for the Preparation of the Monodisperse Particles of the Invention.

The invention also relates to a method for the preparation of monodisperse particles having a single pure crystalline phase of a RE-containing lattice, a uniform three-dimensional size, and a uniform polyhedral morphology. In a reaction vessel the method first dissolves a precursor metal salt, or a mixture of precursor metal salts, in a solvent to form a solution. The reaction vessel is then placed in a heated salt bath having a temperature of at least about 340° C. Applying heat to the salt bath to rapidly decompose the precursor metal salts in the solution to form the monodisperse particles. The reaction vessel is then kept in the salt bath for a time sufficient to increase the size of the monodisperse particles. The reaction vessel is then removed from the salt bath; and the reaction quenched with ambient temperature solvent.

The particles of the invention are synthesized through thermal decompostion of precursor metal salts of the desired particle composition components. One of ordinary would know the precurosr salts which may be used to yield a particular particle composition. The precursor metal salt may be a trifluoroacetate, chloride, nitrate, acetylacetonate, acetate, a diethyl-dithiocarbamate (ddtc) salt, a 1, 10 phenanthroline diethyl-dithiocarbamate (phen)(ddtc) salt, an oleate, an oxalate, and the like. The halide compositions may be prepared from thrihoaceates, e.g., trifluoracetates for floirde composition. The oxide composition may be prepared from acetates, actylacetoantes, etc. The oxysulfides are prepared from precursor salts containing oxygen and sulfur, e.g., (phn)(ddtc) salt. The sulfides may be prepared the same as the oxysulfides but under hydrogen/argon atmosphere. The oxychlorides are prepared the same as the oxysulfides but using RE chloride precursors. The desired stoichimetric combination of precursor metal salts are first dissolved in a solvent to form a solution of the precursor compounds, for example in a 100 mL, 3-neck flat-bottom flask. Suitable solvents include, but are not limited to, a mixture of oleic acid and 1-octadecene, oleylamine, trioctylamine, trioctylphosphine, squalene, trioctylphosphine oxide, hexadecylamine, and the like, which are typically solids at room temperature. A preferred solvent for the synthesis of monodisperse particles of the invention is a mixture of oleic acid and 1-octadecene. The oleic acid and 1-octadecene may be mixed in a 1:1 ratio. The mixture is typically heated under vacuum at 100° C. to dissolve the trifluoracetate salts and remove excess water. The reaction vessel containing the hot is preferably purged with an inert gas such as nitrogen. The vessel is then placed in a molten salt bath while still purging with the inert gas. The salt bath should have a temperature of at least about 340° C. Salt baths known in the art may be used, with a 1:1 $KNO_3$/$NaNO_3$ salt bath being preferred. The salt bath acts as the heat reservoir to ensure the fast and uniform heating of the solution and also to compensate the disparity in decompostion temperature among various trifluoroacetate salts. The temperature of the salt bath should be maintained throughout the entire reaction. Once the reaction is complete, the vessel is removed from the salt bath and the reaction quenched with room temperature solvent and the reaction stopped. In the case of a solvent mixture, such as oleic acid and 1-octadecene, one or both components can be used—for oleic acid/1-octadecene, 1-octadecene may preferably be added to quench the reaction. The product particles may then be precipitated by addition of an antisolvent, such as ethanol, and recovered by means known in the art such as centrifugation, filtration, etc. The particles may be washed by resuspending them in a non-polar solvent such as hexane, recovered, and dried at room temperature, with heat, and/or with vacuum.

When oleic acid/1-octadecene is used as the solvent, it has been observed using FTIR that some oleic acid attaches to the particle surface during the reaction, although subsequent washings of the particles can remove oleic acid. This is presumably due to the carboxylic acid functional group in the oleic acid. Conducting the reaction in the presence of solvents having such functional groups which may attach to the surface of the monodisperse particles, or adding such compounds to the reaction, then is one route to introduce functionality to the particle surface. In the case of oleic acid, although not to be bound by theory, it is believed that the oleic acid acts as a surfactant, assisting in the coordination of the precursor lattice framework. Under high temperature, oleic acid molecules form ionic bonds between the carboxyl group of the oleic acid and the RE ions in the crystal lattice. The oleic acid functionalization also is believed to assist in suspending the monodisperse particles of the invention in hexane or other non-polar solvents and in their self-assembly into superlattices. Monodisperse particles of the invention having oleic acid surface modification represent another embodiment of the invention.

Particle size and morphology may be controlled by varying reaction conditions such as stoichiometric precursor metal salt ratio, heating rate of the salt bath, and reaction time. The initial rate of heating in the salt bath is important in determining the morphology by selecting which crystal planes will undergo the most rapid growth. Final particle size is determined by total reaction time in the salt bath as well as precursor ratios. After the reaction vessel reaches the temperature of the salt bath, the longer the time the vessel remains in the salt bath the larger the particles may grow.

Superlattice Assembly

Due to their uniformity in size and morphology, the monodisperse particles of the invention are able to self assemble into superlattice structures. These superlattice structures represent the lowest free energy conformation for the assemblage. This uniform build-up is accomplished with monodisperse particles of uniform size and morphology as according to the invention. The superlattices form via interfacial self-assembly, building hierarchical structures with orders on different length scales. Superlattices of the monodisperse particles of the invention may be formed by suspending the particles in a solvent and then drop-casting them onto a surface. As the solvent slowly evaporates, the particles arrange themselves into a superlattice with both positional and orientational order. Any solvent which disperses the particles may be used, such as, but not limited to, benzene, carbon tetrachloride, chlorobenzene, chloroform, cyclohexane, dimethyl-formamide, dimethyl sulfoxide, ethanol, heptane, hexane, pentane, tetrahydrofuran, toluene, with non-polar organic solvents such as hexane being preferred.

Superlattices of the invention may be transparent films of the monodisperse particles of the invention, particularly with monodisperse nanoparticles of the invention. In order to form a superlattice the constituent particles must be of identical or nearly identical size and shape. When both conditions are met a uniform, patterned, monolayer of particles forms. Advantageously, the monodisperse particles of the invention meet this criteria for uniform size and uniform morphology. Due to the small size and uniformity of the particles of the invention, there is no scattering of light and as a result a transparent film is obtained.

Uses

With their uniform three-dimensional size and uniform polyhedral morphology, the monodisperse particles of the invention are superior to inorganic phosphors known in the art. Just as with currently known inorganic particles, monodisperse particles of the invention may be used as labels or taggants for security/authentication uses, in assays, in biomedical applications, etc., such as described above. In security applications, for example, the ability to tailor not only the particle composition but also its morphology gives infinite amount of combinations which can be loaded into inks, onto fibers, etc. for documents with unique signatures based on particles having different morphologies and photonic properties. Multi-component security fibers which can be incorporated into a document during the papermaking process can have monodisperse particles of the invention with the same composition but different morphologies in the sheath and core of the fiber. They can be distinguished optically through their temporal properties. The monodisperse particles or a combination of different monodisperse particles may be introduced into the fiber by absorption or by addition to the fiber stock in the fiber making process as is known in the art. U.S. Pat. No. 6,974,623, for example, describes the incorporation of luminescent materials into mottled fibers for security documents and is incorporated herein by reference. Using techniques known in the art, monodisperse particles may also be incorporated into an ink, as a pigment, and the ink used to print at least a portion of a security document. Accordingly, a security document containing monodisperse particles of the invention is an embodiment of the invention. A fiber containing monodisperse particles of the invention is another embodiment of the invention.

In biomedical applications, a particular phosphor composition may have regulatory approval for its use and particles of the invention, with their different uniform morphologies, can provide a unique combination of particles of the composition but with different optical/photonic properties. In another embodiment of the invention, the monodisperse particles may be functionalized by surface-treating or coating with a biological macromolecule which is adsorbed or chemically bonded to the particle surface. Exemplary biological macromolecules may be, for example, antibodies, streptavidin, avidin, proteins, a lipoprotein, polypeptide ligands of cellular receptors, polynucleotide probes, drugs, antigens, toxins, and the like. Surface-treating the monodisperse particles of the invention with such biological macromolecules can be accomplished using techniques known in the art (see, e.g., U.S. Pat. Nos. 5,043,265 and 5,698,397), and functionalizes the particles for use in assays, biomedical diagnostics and imaging, and medical treatment such as photodynamic therapy. The oleic acid—functionalized monodisperse particles of the invention may undergo a ligand exchange replacing the hydrophobic oleic acid molecules with a biological macromolecule as described or with various ligands or polymers such as polyethylene glycol, PEG; polyacrylic acid, PAA; polyethyleneimines, PEI; and other ligands and polymers known in the art. The ligands or polymers may be hydrophilic or lipophilic. The functionalization coatings are adhered to the crystal surface by physical adsorption and/or ionic interactions between the RE ions and various carboxyl groups, amine groups, or other functional groups. The carboxylic acid or amine derivatized particles can be further functionalized with avidin, protein, antibody, or any other biological or chemical agents through covalent linkage and activation of surface amines or carboxyls. Accordingly, the invention relates to a monodisperse particle of the invention carrying a biological macromolecule bound or physically adsorbed to the particle surface. The particle may be a monodisperse phosphor particle of the invention which can function as a luminescent label. Another embodiment relates to monodisperse particles have a ligand or a polymer bound or physically adsorbed to its surface.

As discussed above, the monodisperse particles of the invention possess the unique ability to self assemble into superlattices. In such superlattices there are cooperative interactions which produce physical properties recognized as characteristic of bulk materials. Like atoms or molecules, but in the next level of hierarchy, monodisperse particles of the invention, particularly in the form of nanocrystals, serve as the building blocks to new designer solids. Techniques to produce well ordered 2D monolayers and 3D colloidal crystalline solids are also finding wide application. (See, e.g., C B Murray, C R Kagan and M G Bawendi, *Science* 270 (5240):1335-1338, Nov. 24, 1995; D V Talapin, E V Shevchenko, C B Murray, A Kornowski, S Forster and H Weller, *JACS* 126 (40):12984-12988, Oct. 13, 2004). The assembly of nanocrystals can enable design of new solid state materials and devices.

As discussed herein, an interfacial assembly process may be used to organize the monodisperse particles into superlattices over multiple length scales (from nanometer to submillimeter scale). This advantageously facilitates particle characterization and enables systematic studies of shape-directed assembly. The global and local ordering of these superstructures is programmed by the control over monodisperse particle's anisotropy attributes such as faceting, aspect ratio, etc., which are features of the monodisperse particles of the invention.

The superlattices of the invention are nanocrystal thin films which can be utilized in many different fields such as optical films for enhancement of solar cells, XRay scintillators, heat reduction through blocking/reflecting of IR light. Other applications include lighting, detectors, displays, etc., solar and other energy efficient lighting solutions such as LEDs and energy converting coatings for fluorescent lighting, which are high priorities for the nanophosphor technology. In solar applications, the nanocrystals, as monodisperse particles or superlattices, can enhance the overall efficiency of the cell without greatly increasing the cost. The ability to tune the absorption and emission properties of the monodisperse particles of the invention up and down the electromagnetic spectrum allows for the design of materials which absorb the atmospheric solar wavelengths outside the absorption range of conventional silicon-based solar cells and convert those to visible and near IR wavelengths within the capacity of silicon. The monodisperse particles and superlattices of the invention may be incorporated into various thin films for the solar cells, which provide an excellent substrate for efficient energy conversion of the solar spectrum due to the minimal scattering and other losses that would be seen in less uniform nanocrystals.

$NaYF_4$-Based Particles as an Illustration of the Invention

By way of example to illustrate the monodisperse particles of the invention, but not to limit the invention, the following discussion is directed to $NaYF_4$-based UCNPs, which represent a preferred embodiment of the invention.

Hexagonal phase, $\beta$-$NaYF_4$-based UCNPs were synthesized through thermal decompostion of sodium and lanthanide trifluoroacetates dissolved in a mixture of oleic acid and 1-octadecene. The use of molten salt bath as the heat reservoir ensures the fast and uniform heating of the solution and also to compensate the disparity in decompostion temperature among various trifluoroacetate salts. Transmission electron microscopy (TEM) images of the UCNPs of various shapes and compositions are shown in FIG. 3. FIG. 3 shows TEM images of the $\beta$-$NaYF_4$-based UCNPs; (a, d, g, j) TEM images of $NaYF_4$:Yb/Er (20/2 mol %) UCNPs; (b, e, h, k) TEM images of $NaYF_4$:Yb/Tm (22/0.2 mol %) UCNPs; (f, i) TEM images of $NaYF_4$:Yb/Ho (20/2 mol %) UCNPs; and (c, l) TEM images of $NaYF_4$:Yb/Ce/Ho (20/11/2 mol %) UCNPs. All scale bars in FIG. 3 represent 100 nm. For the case of $NaYF_4$:Yb/Er (20/2 mol %), an optimized composition for efficient upconversion (32), the morphologies of the UCNPs can be tuned from spherical hexagon nanocrystals (FIG. 3a), nanorods (FIG. 3d), hexagonal nanoprisms (FIG. 3g) to hexagonal nanoplates (FIG. 3j) by adjusting the reaction time or the ratio of sodium to lanthanide trifluoroacetates. The $\beta$-$NaYF_4$ monodisperse particles of the invention can take the form of hexagonal spheres, prisms, or plates as shown in FIG. 3. For each of the morphologies possess a pure hexagonal crystal phase. The particles on FIG. 3a appear spherical due to their small size and the limits of image resolution, but in fact are hexagonal and may be labeled "spherical hexagons."

Figures 3A, 3B, 3C:
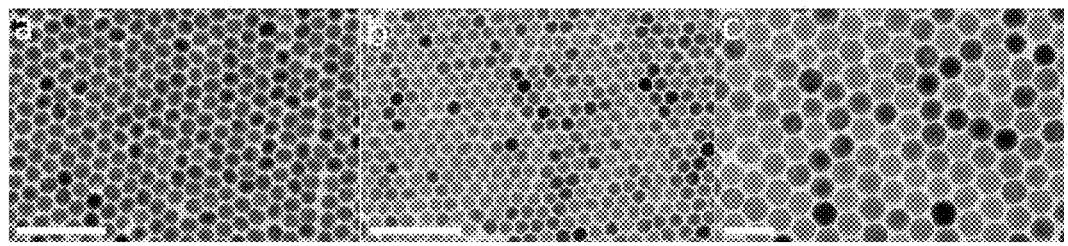
FIGS. 3A-3L show TEM images of the $\beta$-$NaYF_4$-based upconverting nanophosphor particles of the invention.
Figures 3D, 3E, 3F:
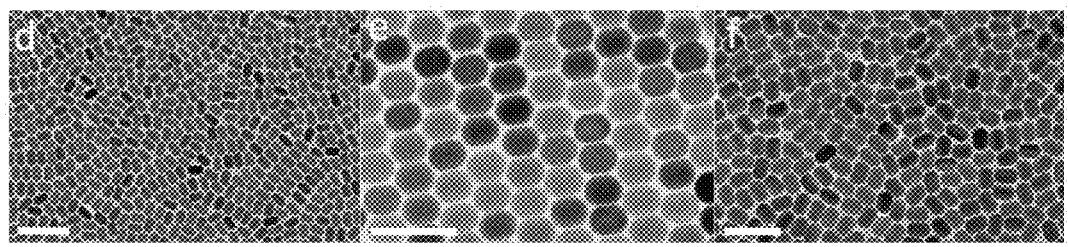
Figures 3G, 3H, 3I:
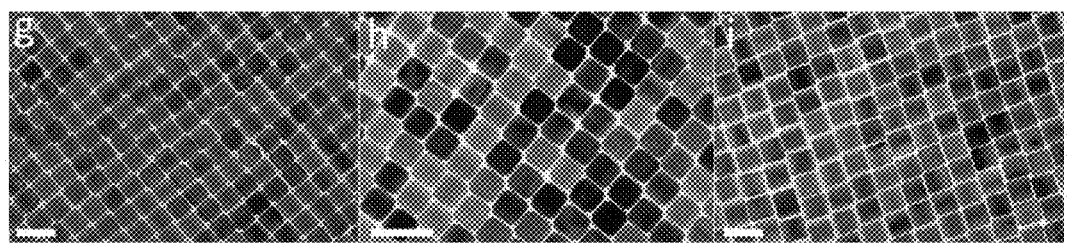
Figures 3J, 3K, 3L:
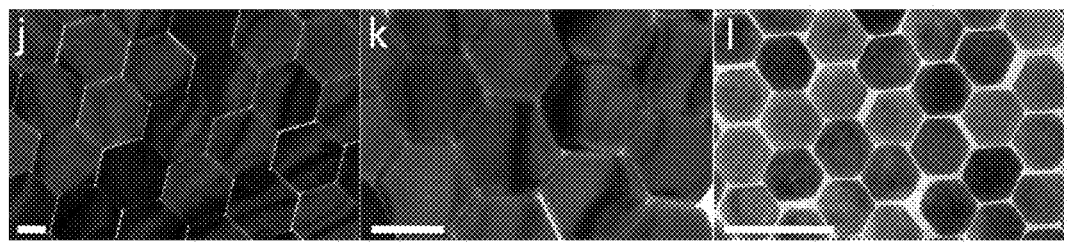

The structural and optical characterization of the $\beta$-$NaYF_4$-based UCNPs are shown in FIG. 4: (a) Powder X-ray diffraction patterns of the $NaYF_4$:Yb/Er (20/2 mol %) UCNPs with different shapes. The peaks are indexed according to the standard pattern of $\beta$-$NaYF_4$(JCPDS file number: 28-1192). Insets are the corresponding structural models. (b) High-resolution TEM (HRTEM) image of a spherical $NaYF_4$:Yb/Er (20/2 mol %) UCNP. (c) HRTEM image of a $NaYF_4$:Yb/Er (20/2 mol %) nanorod. (d) HRTEM image of a $NaYF_4$:Yb/Er (20/2 mol %) hexagonal nanoprism. (e) HRTEM image taken from the edge of a $NaYF_4$:Yb/Er (20/2 mol %) hexagonal nanoplate. (f) Room temperature upconversion emission spectra of the $NaYF_4$:Yb/Er (20/2 mol %) and $NaYF_4$:Yb/Tm (22/0.2 mol %) UCNPs dispersed in hexane. Inset: Photographs of the upconversion luminescence from the $NaYF_4$:Yb/Er (20/2 mol %) (left) and $NaYF_4$:Yb/Tm (22/0.2 mol %) (right) nanorod solutions under 980 nm diode laser excitation. (g) Room temperature upconversion emission spectra of the $NaYF_4$:Yb/Ho (20/2 mol %) and $NaYF_4$:Yb/Ho (20/1 mol %) UCNPs dispersed in hexane. Inset: Photographs of the upconversion luminescence from the $NaYF_4$:Yb/Ho (20/2 mol %) nanoprism (left), $NaYF_4$:Yb/Ho (20/2 mol %) nanorod (middle) and $NaYF_4$:Yb/Ho (20/1 mol %) nanorod (right) solutions under 980 nm diode laser excitation. Powder X-ray diffraction (XRD) patterns confirm that all the $NaYF_4$:Yb/Er (20/2 mol %) UCNPs are of a single pure $\beta$-$NaYF_4$ crystalline phase (FIG. 4a). The XRD patterns of the spherical NCs and the nanorods exhibit enhanced (h00) as well as diminished (002) reflections, whereas a reversed trend is observed in the case of hexagonal nanoprisms and nanoplates. These results imply that the majority of spherical hexagon nanocrystals and nanorods are as-deposited with the [0001] direction (c-axis) parallel to the glass substrates used for XRD measurements. In contrast, most hexagonal nanoprisms and nanoplates are sitting with the c-axis perpendicular to the substrates. Supporting this interpretation are the results of TEM characterization of samples prepared in a similar way (fast deposition from a hexane solution). High-resolution TEM (HRTEM) image of a single spherical NC shows clear lattice fringes associated with the (10 0), (10 1) and (0001) hexagonal crystal planes, respectively (FIG. 4b). Lattice fringes corresponding to the (0001) planes appear along the nanorods, indicating that the nanorods grow along the c-axis (FIG. 4c). HRTEM analysis also reveals that the "cube-like" hexagonal prism is composed of six square or rectangular {10 0} side facets with two hexagonal bases belonging to the (0001) planes (FIG. 4d). The formation of nanorods and hexagonal nanoprisms is determined by the delicate interplay between the growth rates of {0001} and {10 0} planes at different growth stages. This is in contrast to the previous studies where shape evolution of the β-NaYF$_4$ nanocrystals was dominated by the Ostwald-ripening process (31). Furthermore, dynamic light scattering experiments that probe the hydrodynamic size of the dispersed nanorods and hexagonal nanoprisms show results consistent with the largest dimensions of individual nanocrystals measured from the TEM images. In addition, quantitative elemental analyses based on inductively coupled plasma optical emission spectrometry (ICP-OES) indicate the proportional incorporation of precursor lanthanide elements into the final UCNPs. By increasing the sodium to lanthanide ratio and the reaction time, hexagonal nanoplates with an edge length of 133±5 nm and a thickness of 104±8 nm are obtained (FIG. 3j). HRTEM image taken from the edge region confirms its high crystallinity (FIG. 4e). It is worth pointing out that although the possibility of cubic to hexagonal (α→β) phase transition cannot be ruled out under the present synthesis conditions, no definitive signature of this was observed.

Figure 4F:
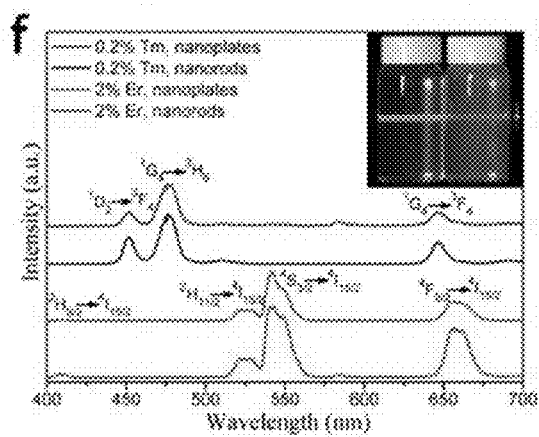

The NaYF$_4$:Yb/Er (20/2 mol %) UCNPs of the invention exhibit intense upconversion luminescence under 980 nm excitation (FIG. 4f). Three visible emission bands centered at 525, 542, and 655 nm are observed, attributable to the radiative transitions from the ($^2$H$_{11/2}$, $^4$S$_{3/2}$) (green) and from the $^4$F$_{9/2}$ (red) excited states to the $^4$I$_{15/2}$ ground state of Er$^{3+}$, respectively. The activator Yb$^{3+}$, capable of absorbing the 980 nm near-infrared light efficiently, transfers its energy sequentially to nearby Er$^{3+}$ through the $^2$F$_{5/2}$ (Yb$^{3+}$)→$^4$I$_{11/2}$ (Er$^{3+}$) process, pumping the Er$^{3+}$ to its emitting levels. The multiphonon relaxation processes help bridging the different excited states of Er$^{3+}$, giving rise to distinct emission peaks. The NaYF$_4$:Yb/Er (20/2 mol %) UCNPs of the invention obtained, display size-dependent optical properties (FIG. 4f). Both the total intensity of emission and the intensity ratio of green to red emission increase as the NCs get larger. This can be ascribed to the fact that as the size of the nanocrystals decreases, surface defects- and ligands-induced quenching of upconversion become more important, which modifies the relative population among various excited states through phonon-assisted nonradiative relaxations (32). In addition, larger nanocrystals contain more emission centers (Er$^{3+}$) under the same doping level and thus, are expected to be brighter. Therefore, engineering not only the dopant concentration but also the surface functionalities of the UCNPs can be an effective means of tuning the upconversion luminescence.

Figure 4G:
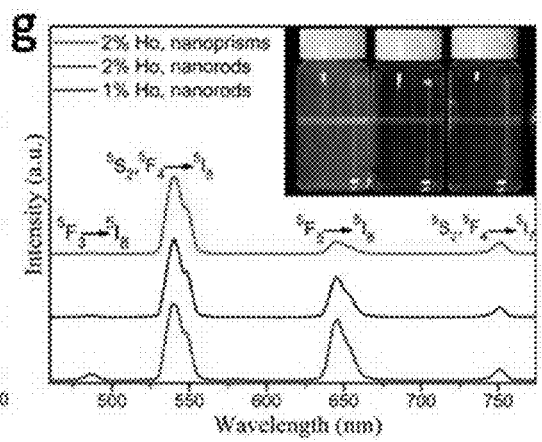

To demonstrate the generality of the synthesis method and further tailor the upconversion emissions, several other exemplary dopant combinations were prepared including Yb/Tm, Yb/Ho, and Yb/Ho/Ce for the β-NaYF$_4$-based UCNPs. TEM images of the NaYF$_4$:Yb/Tm (22/0.2 mol %) UCNPs with different morphologies are shown in FIG. 3b (spherical hexagonal nanocrystals), FIG. 3e (nanorods), FIG. 3h (hexagonal nanoprisms), and FIG. 3k (hexagonal nanoplates), respectively. Upon 980 nm excitation, these hexagonal phase UCNPs emit bright blue upconversion luminescence arising from the trivalent thulium $^1$D$_2$→$^3$F$_4$ and $^1$G$_4$→$^3$H$_6$ transitions (FIG. 4f). In addition, predominantly green upconversion emissions were observed from the hexagonal phase NaYF$_4$:Yb/Ho (20/2 mol %) nanorods and nanoprisms UCNPs (FIG. 3f, 3i, 4g). The intensity ratio of green to red emission from the nanorods increases as the Ho$^{3+}$ concentration increases from 1% to 2%, owing to the enhanced energy transfer from the Yb$^{3+}$ sensitizers to adjacent Ho$^{3+}$ ions (33). Furthermore, we have employed the Ce$^{3+}$ ions to modulate the upconversion profiles of the NaYF$_4$:Yb/Ho (20/2 mol %) UCNPs. The parity-allowed 4f→5d transition in the Ce$^{3+}$ ions can effectively depopulate the green-emitting $^5$F$_4$/$^5$S$_2$ states of Ho$^{3+}$ while increasing the population of the red-emitting $^5$F$_5$ state of Ho$^{3+}$ through two cross relaxation pathways: $^5$F$_4$/$^5$S$_2$(Ho$^{3+}$)+$^2$F$_{5/2}$ (Ce$^{3+}$)→$^5$F$_5$(Ho$^{3+}$)+$^2$F$_{7/2}$ (Ce$^{3+}$) and $^5$I$_6$ (Ho$^{3+}$)+$^2$F$_{5/2}$ (Ce$^{3+}$)→$^5$I$_7$ (Ho$^{3+}$)+$^2$F$_{7/2}$ (Ce$^{3+}$) (34). The as-synthesized NaYF$_4$:Yb/Ce/Ho (20/11/2 mol %) spherical hexagonal nanocrystals (FIG. 3c) and hexagonal nanoplates (FIG. 3l) display predominantly red emission under 980 nm excitation although the total intensity of emission is much weaker than other UCNPs. Powder XRD patterns confirmed that both samples are of pure hexagonal phase. The systematic peak shifts to lower angles compared to the standard XRD pattern of β-NaYF$_4$ imply the partial substitution of Y$^{3+}$ ions by the larger Ce$^{3+}$ ions in the β-NaYF$_4$ lattice (Y$^{3+}$, r=1.159 Å; Ce$^{3+}$, r=1.283 Å) (35), which results in the expansion of the unit cell. This differs from previous observation where dopant with a large ionic radii could not be incorporated into the β-NaYF$_4$ lattice (20). In addition, uniform undoped β-NaYF$_4$ nanorods can also be synthesized and represent an embodiment of the invention.

Superlattices composed of anisotropic nanocrystals have attracted great interest due to the rich phase behaviors and the emergent collective properties (36). Further exploiting the intriguing structural diversity of ordered nanocrystal assemblies using β-NaYF$_4$ nanorods and the β-NaYF$_4$-based UCNPs superlattices were formed. FIG. 5 shows NaYF$_4$(AR=1.4) nanorod superlattices. (a) TEM image of a monolayer superlattice of nanorods that are oriented parallel to the substrate. The upper right inset is the corresponding selected-area wide-angle electron diffraction pattern (SAWED) and the lower right inset is the corresponding small-angle electron diffraction pattern (SAED). Both patterns are acquired from an area of ~6.5 μm$^2$. (b) TEM image of a double-layer superlattice of nanorods that are oriented parallel to the substrate. The upper left inset is the high-magnification TEM image acquired from the same domain. The upper right inset is the corresponding SAWED pattern and the lower right inset is the corresponding SAED pattern. Both patterns are acquired from an area of ~6.5 μm$^2$. (c) Optical micrographs of the NaYF$_4$(AR=1.4) nanorod superlattices observed with crossed polarizers. The scale bar represents 30 μm. The birefringence is due to the alignment of the nanorods. (d) An AFM image of the nanorod assemblies showing the domain boundaries.

An interfacial assembly strategy that can produce continuous and uniform nanocrystal superlattice films (37) was employed. When 15 μL of hexane suspension of the β-NaYF$_4$ nanorods with an aspect ratio (AR) of ~1.4 is drop-cast onto the viscous and weakly polar ethylene glycol (EG) surface and is allowed for slow solvent evaporation, large area nanorod superlattices comprised of monolayer and double-layer domains are obtained (FIG. 5a, 5b). The nanorods preferentially aligned with their c-axis parallel to the substrate, exhibiting both positional and orientation order, as evidenced by the corresponding SAED patterns. The striking in-plane ordering of the nanorod superlattices are also revealed by the SAWED patterns, whose spots are due to diffraction of crystallographic lattice planes. Specifically, the strong (002) diffraction spots arise from the anisotropic rod-shape of the individual NCs and their mutual alignment along the c-axis. Interestingly, the appearance of (h00) and simultaneous absence of (110) diffraction spots, together with the recognition that the β-NaYF$_4$ nanorods are enclosed by the {10 0} facets, allows us to conclude that the nanorods are azimuthally aligned along their {10 0} crystal faces. This is accounted for by the in-plane, dense packing of the β-NaYF$_4$ nanorods, possessing a hexagonal cross section and also the interdigitation of ligands, contributing to attractions between adjacent nanorods. Further evidence that supports the explanation is the lateral displacement between neighboring layers in the β-NaYF$_4$ nanorods superlattices. Liquid crystalline order has been observed in concentrated nanorod dispersions (38) and nanorod films prepared by controlled evaporation (39, 40) or by Langmuir Blodgett assembly (41). Viewing the superlattices through a polarizing optical microscope showed the ordering of nanorod films. Optical micrographs (FIG. 5c) indicate domains that are strongly birefringent due to the alignment of nanorods. The multi-domain nature of the nanorod films is also confirmed by the atomic force microscopy (AFM) study. A nanorod with a larger AR (>3) would be better suited for the formation of liquid crystalline phases.

FIG. 6 shows NaYF$_4$ (AR=2.0) nanorod superlattices. (a) TEM image of a monolayer superlattice of nanorods that are oriented parallel to the substrate. The lower right inset is the corresponding SAED pattern acquired from an area of ~2 μm$^2$. (b) TEM image of a double-layer superlattice of nanorods that are oriented parallel to the substrate. The lower right inset is the corresponding SAED pattern acquired from an area of ~2 μm$^2$. (c) TEM image of a monolayer of vertically aligned nanorod superlattices. The upper left inset is the high-magnification TEM image showing the hexagonally closed-packed array of nanorods. The upper right inset is the corresponding SAWED pattern acquired from an area of ~60 μm$^2$. (d) TEM image of a closed-packed hexagonally ordered array of vertically aligned nanorods. The upper right inset is the corresponding SAWED pattern and the lower right inset is the corresponding SAED pattern. Both patterns are acquired from an area of ~6.5 μm.

β-NaYF$_4$ nanorods with an AR of ~2.0 were also used to study the shape-directed assembly behavior: monolayer and double layer superlattices are also obtained by depositing 15 μL of nanorod dispersion (FIG. 6a, 6b). However, when 40 μL of nanorod solution is used, an extended domain (~200 μm$^2$) of vertically aligned nanorods is obtained (FIG. 6c), as seen from the corresponding SAWED pattern. The domain is composed of hexagonally closed-packed perpendicularly aligned nanorod superlattices (FIG. 6d). This is the preferred geometry of nanorod arrays for various applications such as photovoltaics (42).

Figures 7A, 7B:
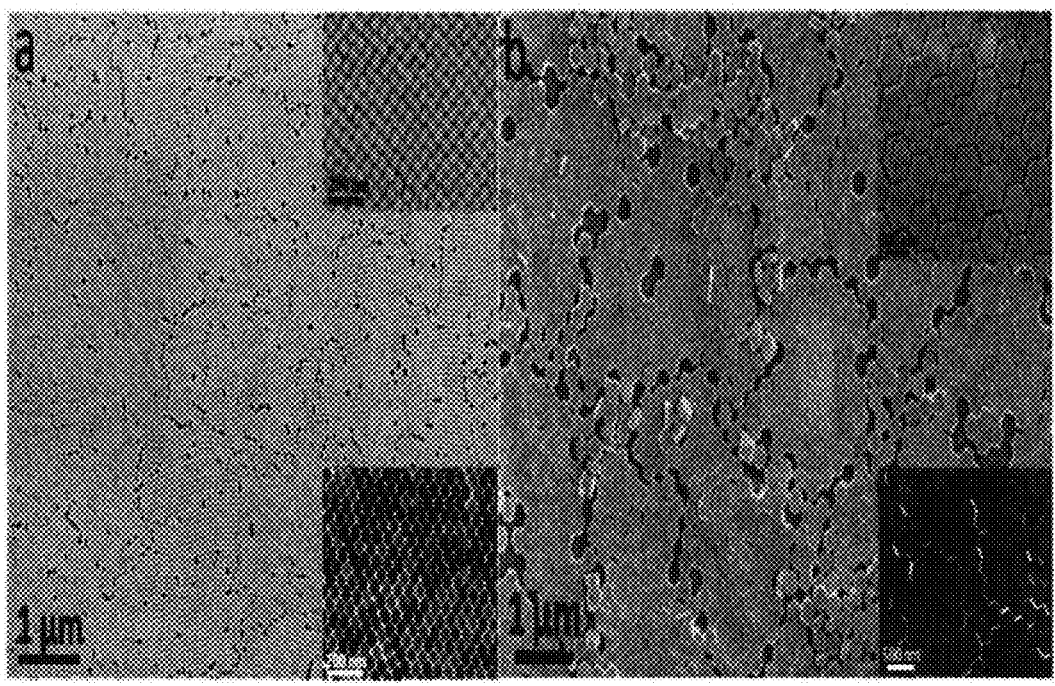
FIGS. 7A-7B show hexagonal nanoprism and nanoplate superlattices of the invention.

FIG. 7 shows hexagonal nanoprism and nanoplate superlattices. (a) SEM image of a monolayer superlattice of NaYF$_4$:Yb/Tm (22/0.2 mol %) hexagonal nanoprisms. The upper right and lower right insets are the high-magnification SEM and TEM images, respectively, showing the local packing motif of the superlattice. (b) SEM image of the self-assembled superlattice of NaYF$_4$:Yb/Er (20/2 mol %) hexagonal nanoplates. The upper right and lower right insets are the high-magnification SEM and TEM images, respectively, showing the hexagonally closed-packed array of the nanoplates.

The ordering of the as-deposited hexagonal nanoprisms and nanoplates films is also strongly dependent on the detailed geometry of individual NCs: Close inspection indicates that in the hexagonal nanoprism assemblies (FIG. 7a), each "cube-like" nanoprism has six neighbors and the packing symmetry deviates from the square lattice that are expected for perfect cubes. The arrangement, in light of recent theoretical work on the packing of fourfold rotationally symmetric superdisks, can be assigned to the $\Lambda_1$ lattice packing. Due to the reduced shape symmetry, the hexagonal nanoprisms self-organize into a configuration that maximizes the packing density. On the other hand, hexagonal nanoplates self assemble into closed-packed hexagonally ordered arrays (FIG. 7b), consistent with the six-fold symmetry of nanoplates.

EXAMPLES

Materials and Methods
Dehydration of Solvents
Precursor salts (trifluoroacetates, chlorides, nitrates, acetylacetonate, acetate, RE(phen)(ddtc)$_3$) ratios are combined as indicated in each example in a 100 ml, 3-neck round bottom flask and dissolved in 1:1 ratio of 1-octadecene/oleic acid (ODE/OA) solvents by heating at ~110° C., under vacuum for at least 45 min using a heating mantle. After 45 min, water is removed from the RE precursor solution; the flask is purged for ~5 min with research grade, nitrogen gas to create an inert atmosphere.

Salt Bath Preparation
The KNO$_3$/NaNO$_3$ salt bath was prepared by combining a 1:1 ratio by weight in a 30 cm in diameter glass heating bath. The salt bath is heated to a steady state temperature of at least 340° C. using a stirring hot plate.

Example 1: Synthesis of Upconversion Nanophosphors (UCNPs)

All syntheses were carried out using standard Schlenk techniques and commercially available reagents. 1-Octadecene (ODE; technical grade, 90%), oleic acid (OA; technical grade, 90%), Na(CF$_3$COO), and ethylene glycol (EG) were purchased from Sigma Aldrich. RE(CF$_3$COO)$_3$ (RE=Y, Yb, Er, Tm) and Y, Yb, and Er 1,000 ppm ICP standard solutions were purchased from GFS Chemicals, Inc. Ho(CF$_3$COO)$_3$ was purchased from Rare Earth Products, Inc. Ce(CF$_3$COO)$_3$ was prepared according to the literature method using cerium(III) carbonate hydrate (Aldrich) and trifluoroacetic acid (Alfa Aesar) as the precursors. A typical protocol for the synthesis of hexagonal phase NaYF$_4$-based UCNPs is described below: certain amount of Na(CF$_3$COO) and Re(CF$_3$COO)$_3$ together with 15 mL of ODE and 15 mL of OA were added to a three-necked flask. The mixture was then heated under vacuum at 100° C. for 45 min to form a transparent, light-yellow solution. The reaction flask was flushed with N$_2$ for 5 min and was then placed into a molten NaNO$_3$/KNO$_3$ (1:1 mass ratio) salt bath that was pre-stabilized at 342° C. A large amount of white smoke was produced after about 1.5 min, indicating the decomposition of metal trifluoroacetates. After 20-35 min of reaction under N$_2$ flow and vigorous magnetic stirring, the solution was cooled down by adding 15 mL of ODE. The products were isolated by adding ethanol and centrifugation. No size-selective fractionation is needed. The UCNPs were redispersed in hexane with nanocrystal concentration of about 5.0 mg/mL. The synthetic conditions for exemplary NaYF$_4$-based particles are given in Table 1. The RE trifluoroacetates RE(CF$_3$COO)$_3$ (RE=Y, Yb, Er, Tm, Ce, Ho) used were obtained as trihydrates (i.e., RE(CF$_3$COO)$_3$.3H$_2$O) and Na(CF$_3$COO) was anhydrous form.

TABLE 1

Synthesis Conditions of β-NaYF$_4$-based UCNPs with 342° C. salt bath.

| Composition | Na(CF$_3$COO)$_3$ | Y(CF$_3$COO)$_3$ | Dopants | Time | Morphology |
|---|---|---|---|---|---|
| NaYF$_4$:Yb,Er | 6.18 mmol | 2.60 mmol | 0.68 mmol Yb(CF$_3$COO)$_3$<br>0.068 mmol Er(CF$_3$COO)$_3$ | 21 min | Spherical Hexagon |
| NaYF$_4$:Yb,Er | 5.62 mmol | 2.60 mmol | 0.68 mmol Yb(CF$_3$COO)$_3$<br>0.068 mmol Er(CF$_3$COO)$_3$ | 23 min | Rod |
| NaYF$_4$:Yb,Er | 5.62 mmol | 2.60 mmol | 0.68 mmol Yb(CF$_3$COO)$_3$<br>0.068 mmol Er(CF$_3$COO)$_3$ | 28 min | Hexagonal Prism |
| NaYF$_4$:Yb,Er | 6.37 mmol | 2.60 mmol | 0.68 mmol Yb(CF$_3$COO)$_3$<br>0.068 mmol Er(CF$_3$COO)$_3$ | 33 min | Hexagonal Plate |
| NaYF$_4$:Yb,Tm | 5.90 mmol | 2.60 mmol | 0.72 mmol Yb(CF$_3$COO)$_3$<br>0.0072 mmol Tm(CF$_3$COO)$_3$ | 21 min | Spherical Hexagon |
| NaYF$_4$:Yb,Tm | 5.62 mmol | 2.60 mmol | 0.72 mmol Yb(CF$_3$COO)$_3$<br>0.0072 mmol Tm(CF$_3$COO)$_3$ | 23 min | Rod |
| NaYF$_4$:Yb,Tm | 5.62 mmol | 2.60 mmol | 0.72 mmol Yb(CF$_3$COO)$_3$<br>0.0072 mmol Tm(CF$_3$COO)$_3$ | 28 min | Hexagonal Prism |
| NaYF$_4$:Yb,Tm | 6.37 mmol | 2.60 mmol | 0.72 mmol Yb(CF$_3$COO)$_3$<br>0.0072 mmol Tm(CF$_3$COO)$_3$ | 33 min | Hexagonal Plate |
| NaYF$_4$:Yb,Ho | 5.62 mmol | 2.60 mmol | 0.68 mmol Yb(CF$_3$COO)$_3$<br>0.068 mmol Ho(CF$_3$COO)$_3$ | 23 min | Rod |
| NaYF$_4$:Yb,Ho | 5.62 mmol | 2.60 mmol | 0.68 mmol Yb(CF$_3$COO)$_3$<br>0.068 mmol Ho(CF$_3$COO)$_3$ | 28 min | Hexagonal Prism |
| NaYF$_4$:Yb,Ho,Ce | 5.62 mmol | 2.25 mmol | 0.68 mmol Yb(CF$_3$COO)$_3$<br>0.068 mmol Ho(CF$_3$COO)$_3$<br>0.36 mmol Ce(CF$_3$COO)$_3$ | 22 min | Spherical Hexagon |
| NaYF$_4$:Yb,Ho,Ce | 5.62 mmol | 2.25 mmol | 0.68 mmol Yb(CF$_3$COO)$_3$<br>0.068 mmol Ho(CF$_3$COO)$_3$<br>0.36 mmol Ce(CF$_3$COO)$_3$ | 28 min | Hexagonal Plate |
| NaYF$_4$ | 4.22 mmol | 2.23 mmol | None | 20-22 min | Rod |

Example 2: Superlattice Formation 2.1 Assembly of UCNPs into Superlattices.

A 1.5×1.5×1 cm$^3$ Teflon well was half-filled with ethylene glycol (EG). Varying concentrations of UCNPs from Example 1, ranging from 1 mg/ml to 20 mg/ml are prepared in hexane, 15 μl of suspension was drop-cast onto the EG surface and the well was then covered by a glass slide to slow down solvent evaporation. This differentiates our assembly setup from being a miniature Langmuir-Blodgett trough without mechanical barriers. After 40 min, the nanocrystal film was transferred onto glass substrates or TEM grids (300-mesh) that was further dried under vacuum to remove extra EG.

2.2 Structural and Optical Characterization

Transmission electron microscopy (TEM) images and electron diffraction patterns were taken on a JEM-1400 Microscope operating at 120 kV. High-resolution TEM (HRTEM) images were taken on a JEOL2010F microscope operating at 200 kV. Scanning electron microscopy (SEM) was performed on a JEOL 7500F HRSEM. Power X-ray diffraction (XRD) patterns were obtained on the Rigaku Smartlab diffractometer at a scanning rate of 0.1° min$^{-1}$ in the 2θ range from 10° to 80° (Cu Kα radiation, λ=1.5418 Å). For XRD measurement, samples were prepared by depositing hexane solutions of nanocrystals onto a glass substrate. Dynamic light scattering (DLS) experiments were performed on a Delsa Nano C system (Beckman Coulter). Atomic Force Microscope (AFM) height images were obtained on the DI Multimode AFM. Quantitative elemental analysis was carried out with inductively coupled plasma optical emission spectrometry (ICP-OES) on a SPECTRO GENESIS ICP spectrometer. Room temperature upconversion emission spectra were acquired with the fiber-optically coupled USB4000 fluorescence spectrometer (Ocean Optics) using an external 200 mW continuous-wave laser centered at 980 nm as the excitation source (Dragon Lasers). The optical photographs of the emitting UCNPs were taken using a Nikon D300 digital camera. Nanorod superlattices on glass substrates were imaged under crossed polarizers using a Leica DMRX upright microscope equipped with a charge-coupled device (CCD) camera (Hitachi KP-M1U).

Example 3: Synthesis of NaYF$_4$:Yb,Er and LiYF$_4$:Yb,Er Particles of the Invention The reaction flask containing the dissolved precursors is submerged into the molten salt bath while still purging with N$_2$ at a steady flow rate. It is important that the salt bath maintains a steady temperature range of 340-343° C. for the entirety of the reaction. After completion of the reaction, the flask is removed from the salt bath and immediately quenched with room temperature ODE. The product is precipitated with ethanol and centrifuged to obtain the nanoparticles. Fourier Transform InfraRed spectroscopy (FTIR) showed oleic acid to be present on the particles' surfaces.

The above protocol is the standard protocol for synthesis of halide, sulfide, and oxysulfide nanoparticles. Particle size and morphology can be controlled by varying reaction conditions such as precursor ratio, heating rate of the salt bath, and reaction time. The initial rate of heating determines the morphology by selecting which crystal planes will undergo the most rapid growth. Final particle size is determined by total reaction time as well as precursor ratios.

Figure 8A:
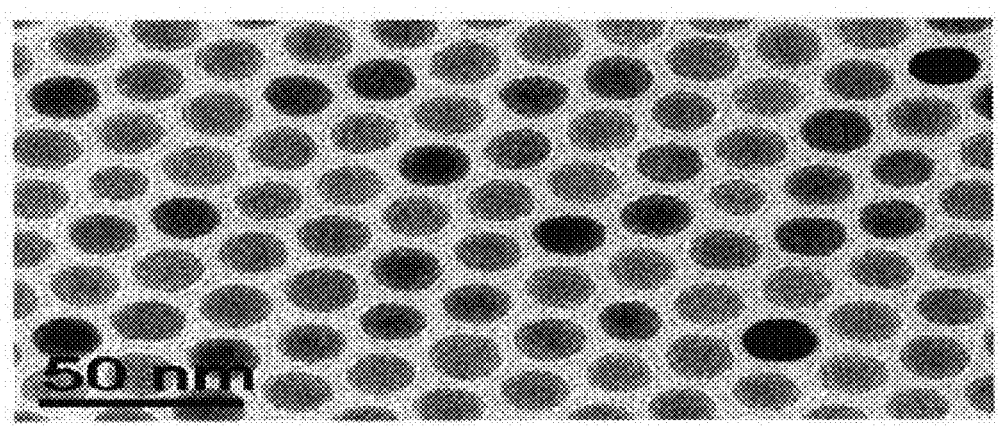
FIGS. 8A-8C show the unique morphologies in the $NaYF_4$:Yb, Er particles of the invention.
Figure 8B:
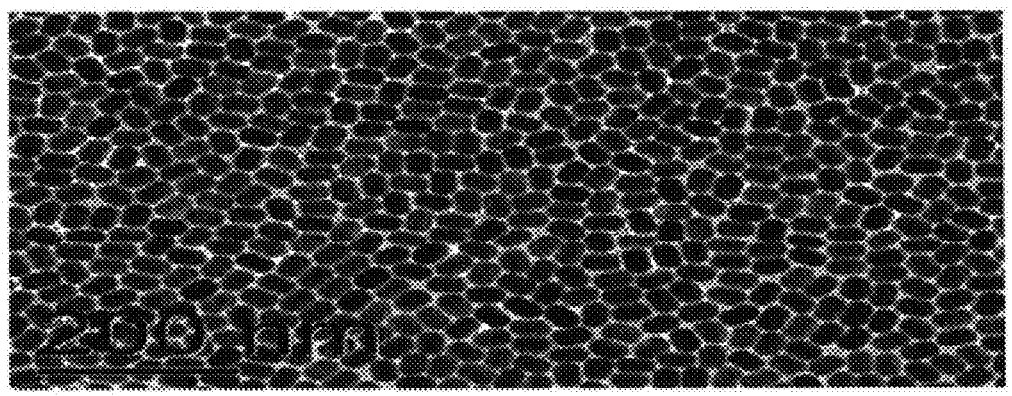
Figure 8C:
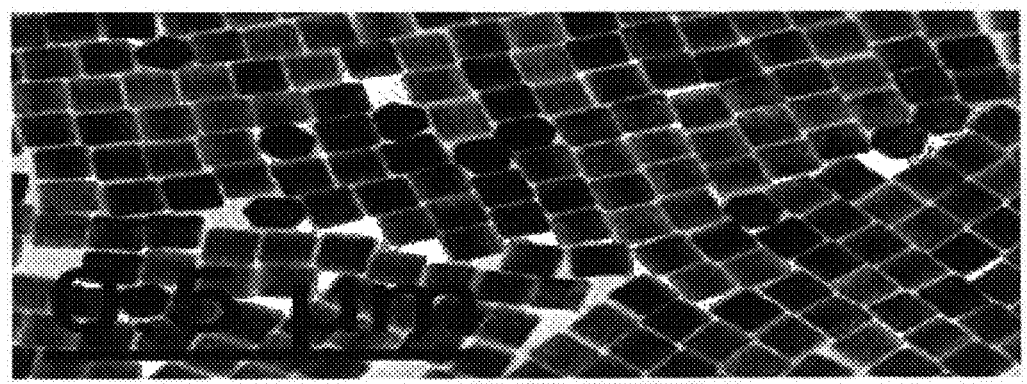

Below is a description of the reaction conditions for three unique morphologies of both NaYF$_4$:Yb,Er and LiYF$_4$:Yb,Er while maintaining narrow size distributions and the same final chemical composition. FIG. 8 shows TEM images of the unique morphologies in the NaYF$_4$:Yb,Er nanoparticle system.

TABLE 2

Reaction conditions for growth of sphere, rod, or prism NaYF$_4$ beta-phase, RE-doped nanoparticles.

| Composition | Na(CF$_3$COO) | Y(CF$_3$COO)$_3$ | Dopants | Time | Morphology |
|---|---|---|---|---|---|
| NaYF$_4$:Yb,Er | 5.62 mmol | 2.60 mmol | 0.68 mmol Yb(CF$_3$COO)$_3$<br>0.068 mmol Er(CF$_3$COO)$_3$ | 21 min | Spherical Hexagon |
| NaYF$_4$:Yb,Er | 5.62 mmol | 2.60 mmol | 0.68 mmol Yb(CF$_3$COO)$_3$<br>0.068 mmol Er(CF$_3$COO)$_3$ | 23 min | Rod |
| NaYF$_4$:Yb,Er | 5.62 mmol | 2.60 mmol | 0.68 mmol Yb(CF$_3$COO)$_3$<br>0.068 mmol Er(CF$_3$COO)$_3$ | 28 min | Hexagonal Prism |

The NaYF$_4$:Yb,Er spherical hexagons and hexagonal prisms are acquired by rapid heating of the reaction flask within the initial nucleation phase of the reaction. This allows for isotropic growth of each crystal plane. The reaction times will determine sphere or prism morphologies, shorter reaction time will provide spheres and longer reaction times will yield larger prisms. A decreased rate of reaction will yield anisotropic growth in the case of the rod shaped nanoparticles. Aspect ratio of the nanorods can also be controlled by reaction time. Table 3 is the quantitative measurement of the particle composition for NaYF$_4$:Yb,Er nanorods and hexagonal prisms. This data shows that unique morphologies can be obtained while having identical or near identical compositions when compared by elemental analysis.

TABLE 3

Quantitative analysis of NaYF$_4$:Yb,Er rod and prism shaped nanoparticles.

| Morphology | Y/% | Yb/% | Er/% |
|---|---|---|---|
| Rod | 75.0 | 23.0 | 2.0 |
| Hexagonal Prism | 77.6 | 20.4 | 2.0 |

TABLE 4

Reaction conditions for growth of sphere, diamond, or bi-pyramidal, LiYF$_4$ beta-phase, RE-doped nanoparticles.

| Composition | Li(CF$_3$COO)$_3$ | Y(CF$_3$COO)$_3$ | Dopants | Temp | Time | Morphology |
|---|---|---|---|---|---|---|
| LiYF$_4$:Yb,Er | 5.62 mmol | 2.60 mmol | 0.68 mmol Yb(CF$_3$COO)$_3$<br>0.068 mmol Er(CF$_3$COO)$_3$ | 330° C. | 22 min | Sphere |
| LiYF$_4$:Yb,Er | 5.62 mmol | 2.60 mmol | 0.68 mmol Yb(CF$_3$COO)$_3$<br>0.068 mmol Er(CF$_3$COO)$_3$ | 343° C. | 22 min | Diamond |
| LiYF$_4$:Yb,Er | 5.62 mmol | 2.60 mmol | 0.68 mmol Yb(CF$_3$COO)$_3$<br>0.068 mmol Er(CF$_3$COO)$_3$ | 343° C. | 28 min | Tetragonal Bi-Pyramidal |

Figure 9A:
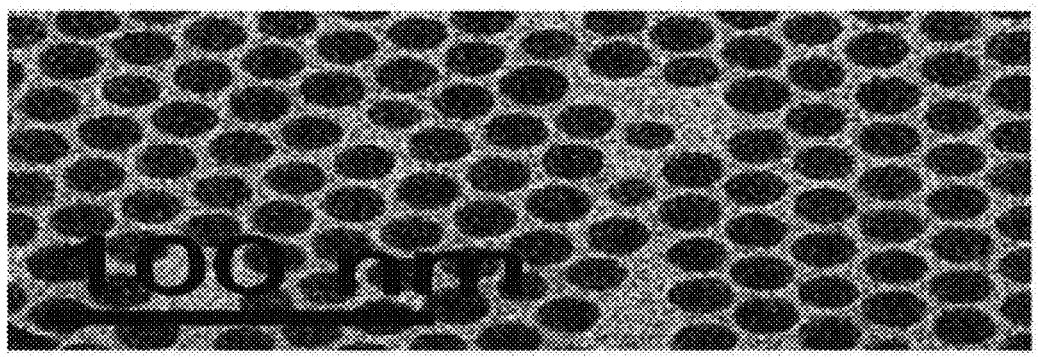
FIGS. 9A-9C show the unique morphologies in the $LiYF_4$:Yb, Er particles of the invention.
Figure 9B:
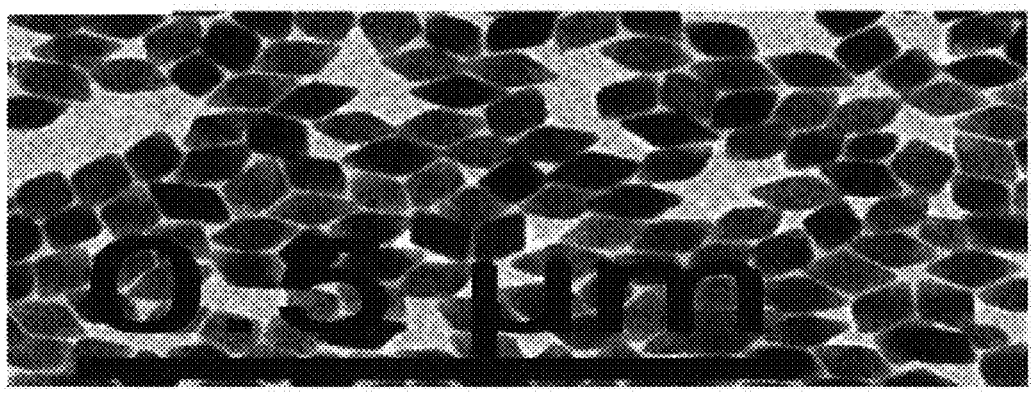
Figure 9C:
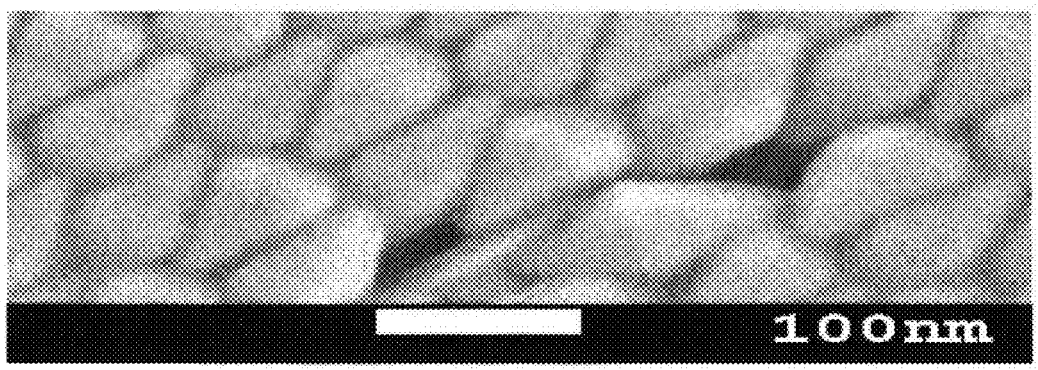
Figure 10A:
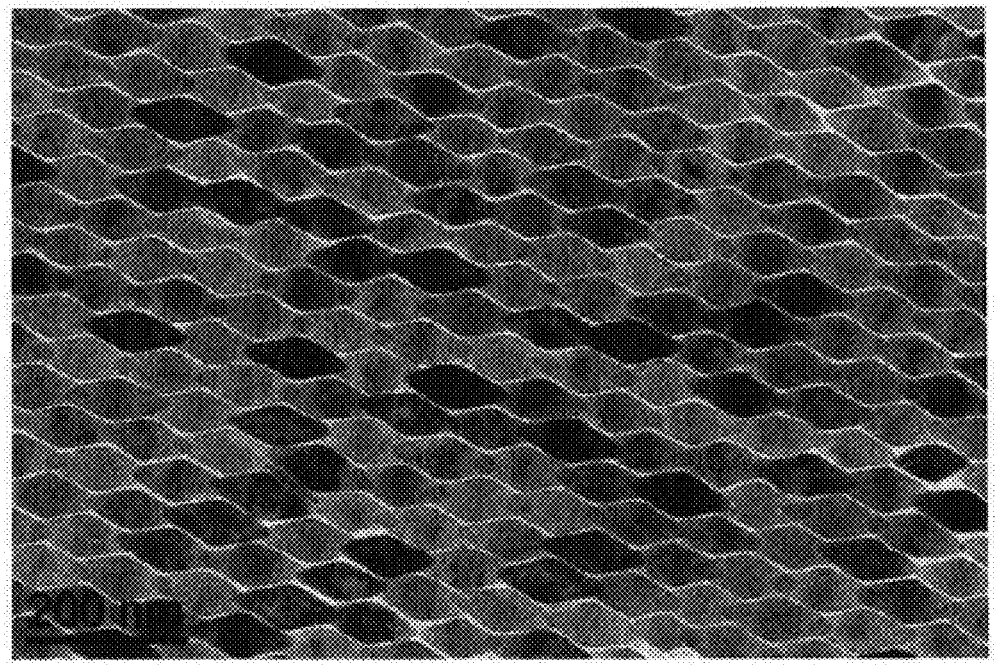
FIG. 10A shows TEM images of $LiYF_4$:Yb,Er tetragonal bi-pyramid particles at ~150 nm.
Figure 10B:
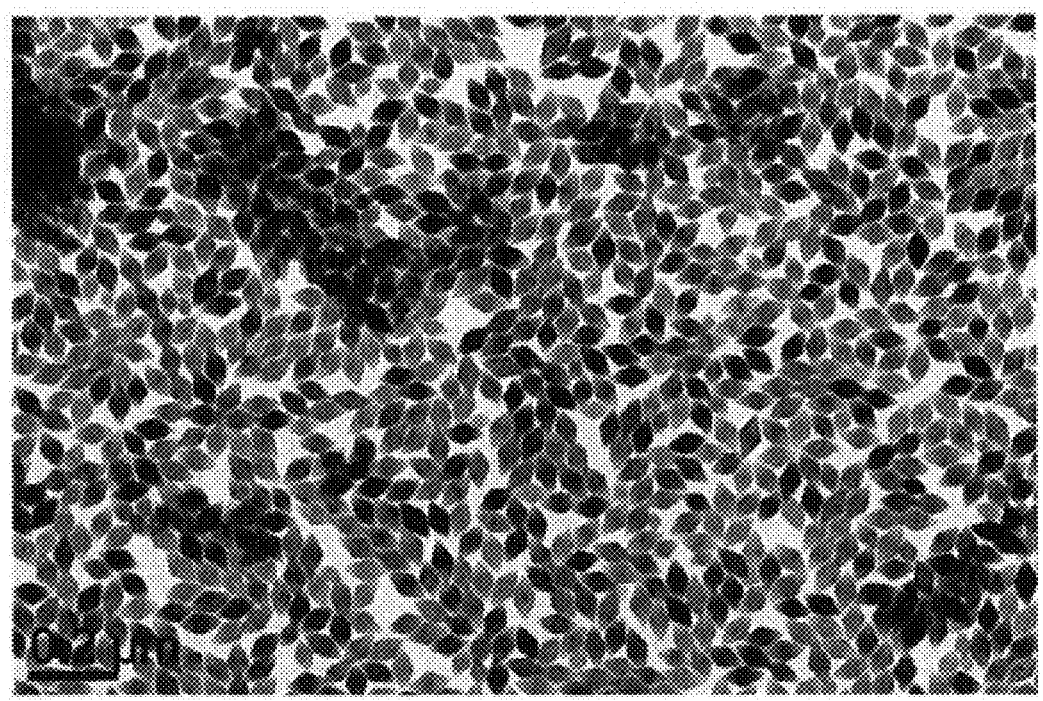
FIG. 10B shows TEM images of the $LiYF_4$:Yb,Er diamond particles at ~75 nm.

As can be seen in Table 4 for LiYF$_4$:Yb,Er, three unique morphologies can be achieved through control of reaction temperature and time while keeping the starting precursor ratios the same. Images of these unique morphologies are shown in FIG. 9. FIG. 9a is a TEM image showing the spheres. FIG. 9b is a TEM image of the diamonds. FIG. 9c is an SEM image showing the tetragonal bipyramids. FIG. 10 shows the TEM images of tetragonal bypyramids in the top panel (FIG. 10A) at ~150 nm and of the diamonds in the bottom panel (FIG. 10B) at ~75 nm. For instance, to achieve either spheres or diamond nanoparticles a reduced reaction temperature of ~10-15° C. is required to yield spheres while a reaction temperature of 343° C. will yield diamonds but the reaction times are identical and both reactions will yield beta-phase LiYF$_4$:Yb,Er nanoparticles. The LiYF$_4$:Yb,Er spheres are an exception to the polyhedral morphology of the monodisperse particles of the invention and represent a separate embodiment of the invention. Finally, a reaction temperature of 343° C. and a longer reaction time of 28 min will yield large (~150 nm) bi-pyramidal nanoparticle morphologies.

Example 4: Functionalization of Monodisperse Particle

The following procedure describes the functionalization of the NaYF$_4$, oleic acid coated particles obtained by ligand exchange of the oleic acid. EDC (1-Ethyl-3-(3-dimethylaminopropyl) carbodiimide hydrochloride, 5 mg) and sulfo N-hydroxysuccinimide (sulfo-NHS, 15 mg) are added to MES buffer (0.1 M, 20 mL, pH 6.0) containing ligand exchanged, PAA-coated NaYF$_4$:Yb,Er nanoparticles (5 mg). The mixture is stirred for 8 h at room temperature. After centrifugation and washing with water, the precipitate is added into PBS buffer solution (0.1 M, 5 mL, pH 7.2) containing streptavidin (2 mg). The linkage reaction is allowed to proceed at 4° C. for 48 h. Then lysine (20 mg) is added to remove any unreacted sulfo-NHS. Finally, streptavidin-functionalized NaYF$_4$:Yb,Er nanoparticles are obtained by centrifugation, and washed three times with water.

Example 5: Exemplary Preparation of Other Monodisperse Particles of the Invention The monodisperse particles of the invention listed in Table 5 were prepared according to the exemplary preparations described below.

TABLE 5

| Composition | Morphology | Reaction Time (min) | Upconversion, Downconversion, Other |
|---|---|---|---|
| LaF$_3$, PrF$_3$, NdF$_3$, SmF$_3$ | Circular plate | 30-60 | Downconversion |
| EuF$_3$ | Orthorhombic | 45 | Downconversion |
| EuF$_3$ (No LiTFA) | Hexagonal | 45 | Downconversion |
| TbF$_3$ | Rhombohedral Plate | 30 | Downconversion |
| DyF$_3$ | Rhombohedral Plate | 30 | Downconversion |
| HoF$_3$ | Rhombohedral Plate | 30 | Downconversion |
| LiHoF$_4$ | Tetragonal bi-pyramid | 30 | Downconversion |
| LiErF$_4$ | Tetragonal bi-pyramid | 22 | Downconversion |
| Gd$_2$O$_2$S:Yb,Er | Hexagonal Plates | 45-60 | Upconversion |
| GdF$_3$ | Rhombic nanoplates | 30 | Downconversion Magnetic |
| Y$_2$O$_3$:Yb,Er | Spherical Hexagons | 30-60 | Upconversion |
| CeO$_2$ | Circular Plates | 30 | Downconversion Oxygen Storage |
| NaGdF$_4$:Tb | Spherical hexagons | 45 | Downconversion |

5.1 Preparation of EuF$_3$ Monodisperse Particles of the Invention (Example of LnF$_3$ Synthesis where Ln can be any RE, in this case Ln is Eu.)

5.05 mmol of Li trifluoroacetate (LiTFA) and 3.26 mmol of Eu trifluoroacetate are weighed and dissolved in a 1:1 mixture of ODE and OA in a 100 ml, 3-neck flask. The mixture is heated at 110° C. under vacuum for 45-60 min until a clear solution is obtained. The solution is then transferred to a molten salt bath, maintained at a steady temperature of 341-343° C. for the entirety of the reaction while purging with N$_2$ gas. The solution reacts for 45 min while stirring. Upon completion of the 45 min reaction, the flask is removed from the salt bath and the solution quenched with room temperature ODE.

The particles are precipitated with ethanol and centrifuged at 8300 rpm for 3 min. The collected particles are washed once more with ethanol and re-suspended in hexane.

Figure 11:
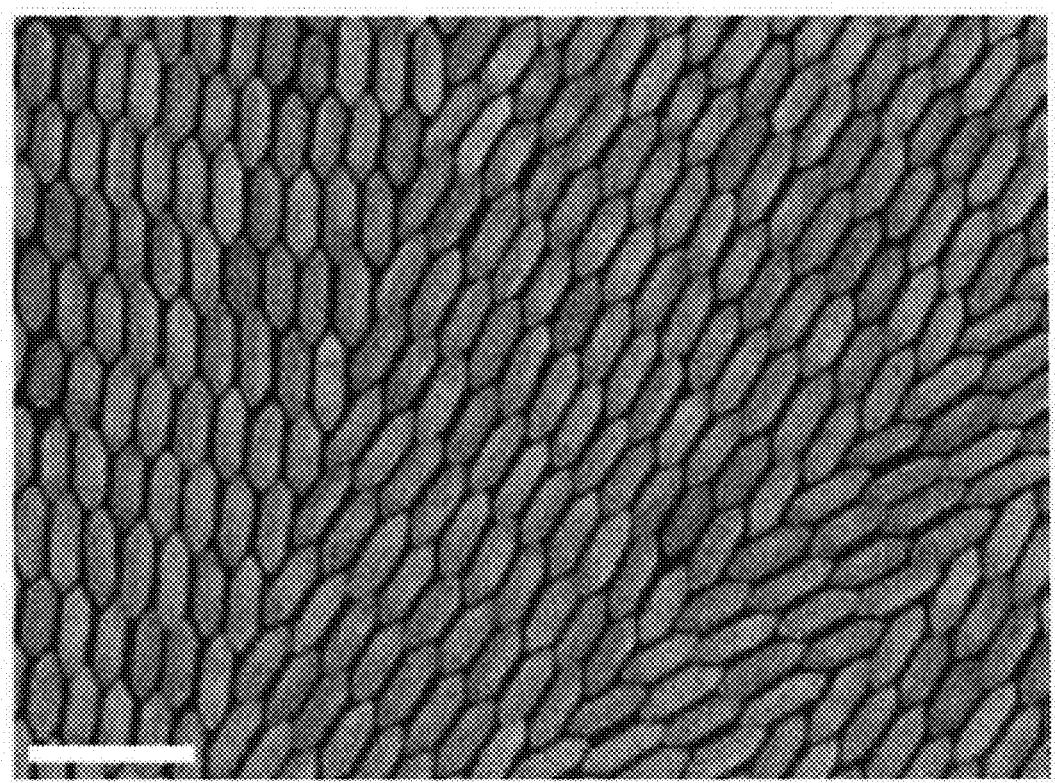
FIG. 11 shows a TEM image of $EuF_3$ particles of the invention.
Figure 12:
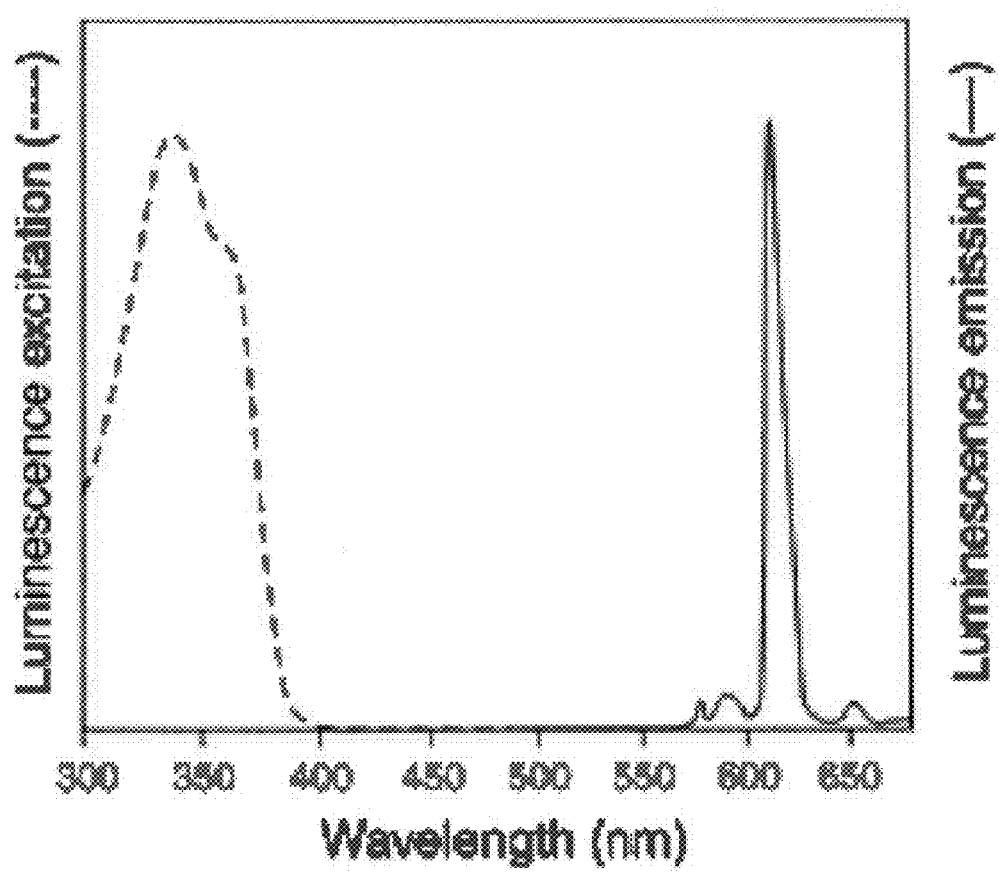
FIG. 12 shows the visible red emission (~610 nm) and associated absorption and emission spectra of $EuF_3$ nanoparticles under UV excitation.

In the instance of EuF$_3$, two distinct morphologies were obtained depending on the presence of LiTFA. The single crystalline phase EuF$_3$ will form a hexagonal nanoplate morphology, however, with the addition of LiTFA, the LiTFA will act as a mineralizer limiting the EuF$_3$ hexagonal growth yielding an orthorhombic nanoplate. FIG. 11 is a TEM image of the EuF$_3$ orthorhombic nanoplates. The scale bar is 100 nm. FIG. 12 shows the visible red emission (~610 nm) and associated absorption and emission spectra of EuF$_3$ orthorhombic nanoplates under UV excitation.

5.2 Preparation of Gd$_2$O$_2$S:Yb,Er Monodisperse Particles of the Invention 2.6 mmol of Gd(phen)(ddtc)$_3$, 0.68 mmol of Yb(phen)(ddtc)$_3$, and 0.68 mmol of Er(phen)(ddtc)$_3$ were weighed and dissolved in a 1:1 ratio of ODE and OA in a 100 ml, 3-neck flask. The mixture is heated at 110° C. under vacuum for 45-60 min until a clear solution is obtained. The solution is then transferred to a molten salt bath, maintained at a steady temperature of 341-343° C. for the entirety of the reaction while purging with N$_2$ gas. The solution reacts for 45 min while stirring. Upon completion of the 45 min reaction, the flask is removed from the salt bath and the solution quenched with room temperature ODE.

The particles are precipitated with a hexane/acetone solution (1:1) and centrifuged at 8300 rpm for 3 min. The collected particles are washed once more with hexane/acetone and re-suspended in water.

5.3 Preparation of Y$_2$O$_3$:Yb,Er Monodisperse Particles of the Invention 2.6 mmol of Yttrium acetate, 0.68 mmol of ytterbium acetate, and 0.068 mmol of erbium acetate are weighed and dissolved in a 1:1 ratio of ODE and OA in a 100 ml, 3-neck flask. The mixture is heated at 110° C. under vacuum for 45-60 min until a clear solution is obtained. The solution is then transferred to a molten salt bath, maintained at a steady temperature of 341-343° C. for the entirety of the reaction while purging with N$_2$ gas. The solution reacts for 45 min while stirring. Upon completion of the 45 min reaction, the flask is removed from the salt bath and the solution quenched with room temperature ODE.

The particles are precipitated with a hexane/acetone solution (1:1) and centrifuged at 8300 rpm for 3 min. The collected particles are washed once more with hexane/acetone and re-suspended in water.

5.4 Preparation of CeO$_2$ Monodisperse Particles of the Invention 0.1 g cerium acetate hydrate, 0.53 g sodium diphosphate, 1 mL oleic acid, 2.5 mL oleylamine, and 4.5 mL 1-octadecene are used as starting materials. The mixture is heated to 120° C. while stirring for 20 min under N$_2$ atmosphere. The mixture is then heated to 330° C. with vigorous magnetic stirring and maintained at this temperature for 30 min under N$_2$ atmosphere. After 30 min, the solution is cooled down and the ceria nanoplates are flocculated by adding ethanol and centrifugation. The nanoplates are redispersed in hexane.

5.5 Preparation of NaGdF$_4$:Tb Monodisperse Particles of the Invention 2.6 mmol of Gadolinium trifluoroacetate and 0.68 mmol of terbium trifluoroacetate are weighed and dissolved in a 1:1 ratio of ODE and OA in a 100 ml, 3-neck flask. The mixture is heated at 110° C. under vacuum for until a clear solution is obtained. The solution is then transferred to a molten salt bath, maintained at a steady temperature of 341-343° C. for the entirety of the reaction while purging with N$_2$ gas. The solution reacts for 45 min while stirring. Upon completion of the 45 min reaction, the flask is removed from the salt bath and the solution quenched with room temperature ODE.

Figure 13:
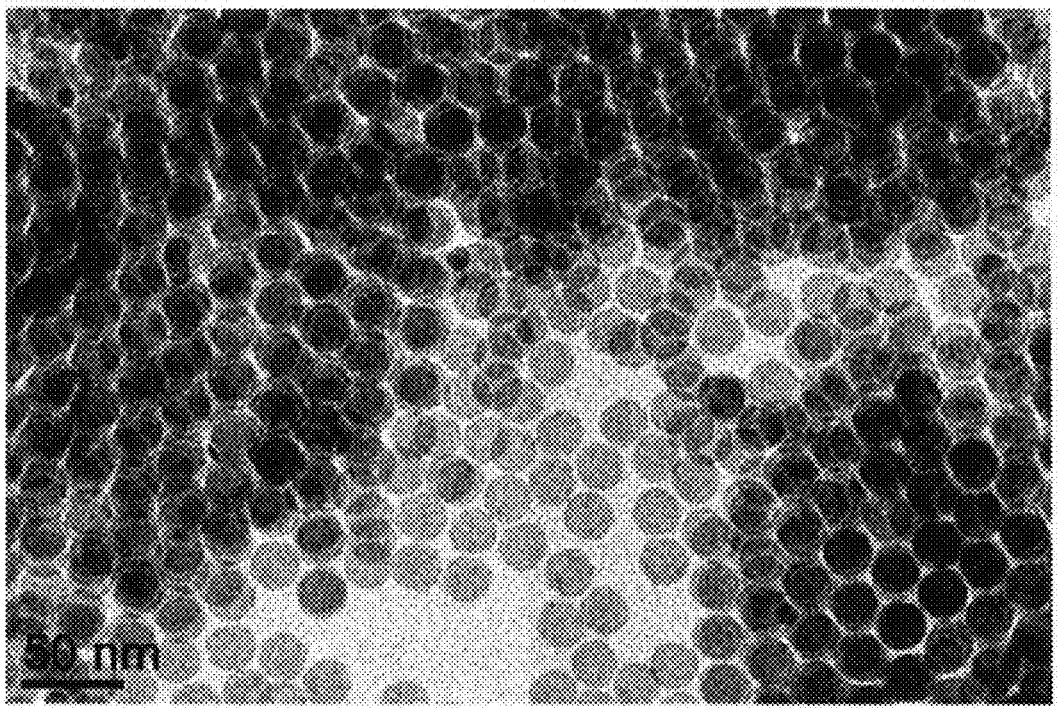
FIG. 13 shows a TEM image of $NaGdF_4$:Tb spherical hexagon particles of the invention.

The particles are precipitated with a hexane/acetone solution (1:1) and centrifuged at 8300 rpm for 3 min. The collected particles are washed once more with hexane/acetone and re-suspended in water. FIG. 13 is a TEM image showing the spherical hexagon morphology of NaGdF$_4$:Tb monodisperse particles of the invention.

Figure 14:
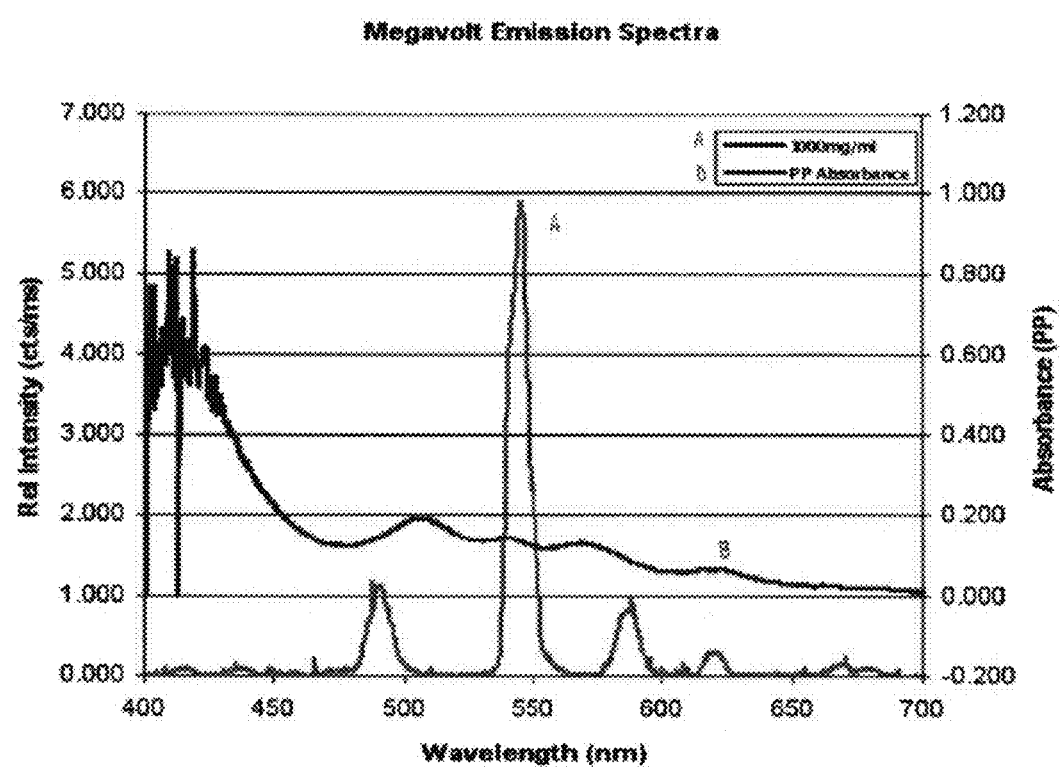
FIG. 14 is the emission spectra from $NaGdF_4$:Tb doped nanoparticles under 6 megavolt X-Ray radiation. The overlaid spectrum is the absorption of a protoporphyrin photosensitizer utilized for Photodynamic Therapy.

FIG. 14 is the emission spectra from NaGdF$_4$:Tb doped nanoparticles under 6 megavolt X-Ray radiation. The overlaid spectrum is the absorption of a protoporphyrin photosensitizer utilized for Photodynamic Therapy. The NaGdF$_4$:Tb particles will absorb the XRay radiation and in turn emit visible radiation capable of exciting the photosensitizer used for treatment of various malignancies.

REFERENCES

The following references and the others mentioned above are incorporated into this specification by reference.
1. Tao A, Sinsermsuksakul P, & Yang P (2007) *Nature Nanotechnology* 2, 435-440.
2. Talapin D V & Murray C B (2005) *Science* 310, 86-89.

3. Sun S H, Murray C B, Weller D, Folks L, & Moser A (2000) *Science* 287, 1989-1992.
4. Shevchenko E V, Talapin D V, Kotov N A, O'Brien S, & Murray C B (2006) *Nature* 439, 55-59.
5. Talapin D V, Shevchenko E V, Bodnarchuk M I, Ye X C, Chen J, & Murray C B (2009) *Nature* 461, 964-967.
6. Urban J J, Talapin D V, Shevchenko E V, Kagan C R, & Murray C B (2007) *Nat. Mater.* 6, 115-121.
7. Cheon J, Park J I, Choi J S, Jun Y W, Kim S, Kim M G, Kim Y M, & Kim Y J (2006) *Proc. Natl. Acad. Sci. U.S.A.* 103, 3023-3027.
8. Peng X G, Manna L, Yang W D, Wickham J, Scher E, Kadavanich A, & Alivisatos A P (2000) *Nature* 404, 59-61.
9. Jana N R, Gearheart L, & Murphy C J (2001) *Journal of Physical Chemistry B* 105, 4065-4067.
10. Sun Y G & Xia Y N (2002) *Science* 298, 2176-2179.
11. Jin R C, Cao Y C, Hao E C, Metraux G S, Schatz G C, & Mirkin C A (2003) *Nature* 425, 487-490.
12. Wang F & Liu X G (2009) *Chemical Society Reviews* 38, 976-989.
13. van der Ende B M, Aarts L, & Meijerink A (2009) *Advanced Materials* 21, 3073.
14. Auzel F (2004) *Chemical Reviews* 104, 139-173.
15. Wu S W, Han G, Milliron D J, Aloni S, Altoe V, Talapin D V, Cohen B E, & Schuck P J (2009) *Proceedings of the National Academy of Sciences of the United States of America* 106, 10917-10921.
16. Kobayashi H, Kosaka N, Ogawa M, Morgan N Y, Smith P D, Murray C B, Ye X C, Collins J, Kumar G A, Bell H, et al. (2009) *Journal of Materials Chemistry* 19, 6481-6484.
17. Zhang P, Steelant W, Kumar M, & Scholfield M (2007) *Journal of the American Chemical Society* 129, 4526.
18. Shalav A, Richards B S, Trupke T, Kramer K W, & Gudel H U (2005) *Applied Physics Letters* 86.
19. Sivakumar R, van Veggel F, & Raudsepp M (2005) *Journal of the American Chemical Society* 127, 12464-12465.
20. Wang F, Han Y, Lim C S, Lu Y H, Wang J, Xu J, Chen H Y, Zhang C, Hong M H, & Liu X G *Nature* 463, 1061-1065.
21. Heer S, Kompe K, Gudel H U, & Haase M (2004) *Advanced Materials* 16, 2102.
22. Wang F & Liu X G (2008)*Journal of the American Chemical Society* 130, 5642.
23. Il Park Y, Kim J H, Lee K T, Jeon K S, Bin Na H, Yu J H, Kim H M, Lee N, Choi S H, Baik S I, et al. (2009) *Advanced Materials* 21, 4467.
24. Suyver J F, Grimm J, van Veen M K, Biner D, Kramer K W, & Gudel H U (2006) *Journal of Luminescence* 117, 1-12.
25. Kramer K W, Biner D, Frei G, Gudel H U, Hehlen M P, & Luthi S R (2004) *Chemistry of Materials* 16, 1244-1251.
26. Yi G S, Lu H C, Zhao S Y, Yue G, Yang W J, Chen D P, & Guo L H (2004) *Nano Letters* 4, 2191-2196.
27. Zeng J H, Su J, Li Z H, Yan R X, & Li Y D (2005) *Advanced Materials* 17, 2119.
28. Zhang Y W, Sun X, Si R, You L P, & Yan C H (2005) *Journal of the American Chemical Society* 127, 3260-3261.
29. Mai H X, Zhang Y W, Si R, Yan Z G, Sun L D, You L P, & Yan C H (2006) *Journal of the American Chemical Society* 128, 6426-6436.
30. Yi G S & Chow G M (2006) *Advanced Functional Materials* 16, 2324-2329.
31. Mai H X, Zhang Y W, Sun L D, & Yan C R (2007) *Journal of Physical Chemistry C* 111, 13730-13739.
32. Mai H X, Zhang Y W, Sun L D, & Yan C H (2007) *Journal of Physical Chemistry C* 111, 13721-13729.
33. Naccache R, Vetrone F, Mahalingam V, Cuccia L A, & Capobianco J A (2009) *Chemistry of Materials* 21, 717-723.
34. Chen G Y, Liu H C, Somesfalean G, Liang H J, & Zhang Z G (2009) *Nanotechnology* 20.
35. Shannon R D (1976) *Acta Crystallographica Section A* 32, 751-767.
36. Glotzer S C & Solomon M J (2007) *Nature Materials* 6, 557-562.
37. Dong A, et al. submitted
38. Li L S, Walda J, Manna L, & Alivisatos A P (2002) *Nano Letters* 2, 557-560.
39. Talapin D V, Shevchenko E V, Murray C B, Kornowski A, Forster S, & Weller H (2004) *Journal of the American Chemical Society* 126, 12984-12988.
40. Ming T, Kou X S, Chen H J, Wang T, Tam H L, Cheah K W, Chen J Y, & Wang J F (2008) *Angewandte Chemie-International Edition* 47, 9685-9690.
41. Kim F, Kwan S, Akana J, & Yang P D (2001) *Journal of the American Chemical Society* 123, 4360-4361.
42. Huynh W U, Dittmer J J, & Alivisatos A P (2002) *Science* 295, 2425-2427.
43. Stebe K J, Lewandowski E, & Ghosh M (2009) *Science* 325, 159-160.

The claimed invention is:

1. A nanocrystal thin film comprising a superlattice of assembled, monodisperse particles, the particles each having:
   a single pure crystalline phase of a rare earth-containing lattice,
   a uniform three-dimensional size, and
   a uniform polyhedral morphology.

2. The nanocrystal thin film of claim 1, wherein the largest dimension of the particles ranges from about 1 nm to 1,000 nm.

3. The nanocrystal thin film of claim 1, wherein at least one dimension of the particles ranges from about 1 um to 250 um.

4. The nanocrystal thin film of claim 1, wherein the rare earth-containing lattice further comprises at least one lattice modifier.

5. The nanocrystal thin film of claim 4, wherein the lattice modifier is an alkali metal and/or an alkaline earth metal.

6. The nanocrystal thin film of claim 1, wherein the particles have crystal symmetries of tetragonal bipyramids, hexagonal prisms, rods, hexagonal plates, ellipsoids, trigonal prisms, or triangular plates.

7. The nanocrystal thin film of claim 1, wherein the particles are down-converting phosphor particles.

8. The nanocrystal thin film of claim 7, wherein the down-converting phosphor particles are selected from the group consisting of rare earth element doped oxides, rare earth element doped oxysulfides, rare earth element doped fluorides, sodium gadolinium fluorides doped with other lanthanides, and lanthanide fluorides.

9. The nanocrystal thin film of claim 1, wherein the particles are up-converting phosphor particles.

10. The nanocrystal thin film of claim 9, wherein the up-converting phosphors are selected from the group consisting of sodium yttrium fluoride, lanthanum fluoride, lanthanum oxysulfide, rare earth oxysulfide, rare earth oxyfluoride, rare earth oxychloride, yttrium fluoride, yttrium gallate, gadolinium fluoride, barium yttrium fluoride, and gadolinium oxysulfide.

11. The nanocrystal thin film of claim 1, wherein the particles are crystalline nanoparticles.

12. The nanocrystal thin film of claim 1 wherein the single pure crystalline phase is a beta-phase.

13. The nanocrystal thin film of claim 1, wherein the rare earth-containing lattice is an yttrium-containing lattice.

14. The nanocrystal thin film of claim 13, wherein the yttrium-containing lattice is selected from $YF_3$, $LiYF_4$, $NaYF_4$, $BaYF_3$, $BaY_2F_8NaYF_4$, $KYF_4$, $Y_2O_2S$, and $Y_2O_3$.

15. The nanocrystal thin film of claim 13, further comprising a dopant selected from La, Ce, Pr, Ne, Pm, Sm, Eu, Gd, Tb, Dy, Ho, Er, Tm, Yb, Lu, and mixtures thereof.

16. The nanocrystal thin film of claim 1, wherein the rare earth-containing lattice is a lanthanide-containing lattice.

17. The nanocrystal thin film of claim 16, wherein the lanthanide-containing lattice is selected from $LaF_3$, $CeF_3$, $PrF_3$, $NeF_3$, $PmF_3$, $SmF_3$, $EuF_3$, $GdF_3$, $TbF_3$, $DyF_3$, $HoF_3$, $ErF_3$, $TmF_3$, $YbF_3LuF_3$, $NaGdF_3$, $Gd_2OS_2$, $LiHoF_4$, $LiErF_4$, CeO, SrS, CaS, and GdOCl.

18. The nanocrystal thin film of claim 16, further comprising a dopant selected from Y, La, Ce, Pr, Ne, Pm, Sm, Eu, Gd, Tb, Dy, Ho, Er, Tm, Yb, Lu, and mixtures thereof, with the proviso that the dopant is not also the lattice lanthanide.

19. An optical film having incorporated therein the nanocrystal thin film of claim 1.

20. A volumetric display having incorporated therein the nanocrystal thin film of claim 1.

* * * * *

UNITED STATES PATENT AND TRADEMARK OFFICE
CERTIFICATE OF CORRECTION

PATENT NO. : 10,066,163 B2
APPLICATION NO. : 15/678344
DATED : September 4, 2018
INVENTOR(S) : Joshua E. Collins et al.

Page 1 of 1

It is certified that error appears in the above-identified patent and that said Letters Patent is hereby corrected as shown below:

In the Specification

In Column 1, Lines 22-33, replace the following:
"This invention was made with U.S. government support under STIR grant R41EB008959 awarded by the National Institute of Health, under grant DMR-0505048 awarded by the National Science Foundation, under grant DMR 05-20020 awarded by the National Science Foundation, under grant NNX08AO0G awarded by the National Aeronautical and Space Agency, under grant W911NF-08-1-0364 awarded by the Army Research Office, under grant DMS-0935165 awarded by the National Science Foundation, and under grant DE-SC0002158 awarded by the Department of Energy. The U.S. government has certain rights in this invention."

With:
--This invention was made with government support under grant numbers DMR0505048, DMR0520020, and DMS0935165 awarded by the National Science Foundation, W911NF-08-1-0364 awarded by the Army Research Office, DE-SC0002158 awarded by the Department of Energy, EB008959 awarded by the National Institutes of Health, and NNX08AO0G awarded by the National Aeronautical and Space Agency. The government has certain rights in the invention.--

Signed and Sealed this
Twenty-third Day of July, 2019

Andrei Iancu
*Director of the United States Patent and Trademark Office*